United States Patent
Niira et al.

(10) Patent No.: US 8,178,778 B2
(45) Date of Patent: May 15, 2012

(54) PHOTOVOLTAIC CONVERSION ELEMENT AND MANUFACTURING METHOD THEREFOR, AND PHOTOVOLTAIC CONVERSION MODULE USING SAME

(75) Inventors: Koichiro Niira, Higashiomi (JP); Tomonari Sakamoto, Higashiomi (JP); Norihiko Matsushima, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 825 days.

(21) Appl. No.: 11/909,593

(22) PCT Filed: Mar. 24, 2006

(86) PCT No.: PCT/JP2006/305987
§ 371 (c)(1),
(2), (4) Date: Dec. 10, 2008

(87) PCT Pub. No.: WO2006/101200
PCT Pub. Date: Sep. 28, 2006

(65) Prior Publication Data
US 2009/0211635 A1      Aug. 27, 2009

(30) Foreign Application Priority Data
Mar. 24, 2005   (JP) ................. 2005-087115

(51) Int. Cl.
*H01L 31/00* (2006.01)
(52) U.S. Cl. ............ 136/258; 257/E21.09; 257/E31.043
(58) Field of Classification Search .................. 136/258; 257/E31.043, E21.09
See application file for complete search history.

(56) References Cited

U.S. PATENT DOCUMENTS

| | | | | |
|---|---|---|---|---|
| 4,906,543 A | | 3/1990 | Aoike et al. ................. | 430/57 |
| 5,498,289 A | * | 3/1996 | Itagaki .......................... | 118/401 |
| 6,294,726 B1 | | 9/2001 | Hässler et al. ................ | 136/258 |
| 6,329,269 B1 | | 12/2001 | Hamada et al. ............... | 438/486 |
| 2001/0011552 A1 | * | 8/2001 | Morizane et al. ............. | 136/251 |
| 2003/0227017 A1 | * | 12/2003 | Yasuno ......................... | 257/53 |
| 2004/0067647 A1 | * | 4/2004 | Saito ............................. | 438/689 |

FOREIGN PATENT DOCUMENTS

| | | |
|---|---|---|
| JP | 58-155773 | 9/1983 |
| JP | 61-231772 | 10/1986 |
| JP | 61-278172 | 12/1986 |
| JP | 1-167760 | 7/1989 |

(Continued)

OTHER PUBLICATIONS

Möller, "Multicrystalline Silicon for Solar Cells," Solid State Phenomena, vols. 47-48 (1996), pp. 127-142.*

(Continued)

*Primary Examiner* — Jennifer Michener
*Assistant Examiner* — Eli Mekhlin
(74) *Attorney, Agent, or Firm* — DLA Piper LLP (US)

(57) ABSTRACT

A photovoltaic conversion element includes a one conductivity-type crystalline Si semiconductor; an opposite conductivity-type semiconductor which is joined to the crystalline Si semiconductor to form a pn junction therebetween; an electrode provided on the opposite conductivity-type semiconductor; and a depletion region formed from the side of the one conductivity-type crystalline Si semiconductor to the side of the opposite conductivity-type semiconductor across the pn junction formed therebetween. The depletion region has a first depletion region located inside the crystalline Si semiconductor and under the electrode, and the first depletion region has an oxygen concentration of 1E18 [atoms/cm$^3$] or less.

8 Claims, 11 Drawing Sheets

FOREIGN PATENT DOCUMENTS

| | | |
|---|---|---|
| JP | 08-274356 | 10/1996 |
| JP | 08-330598 | 12/1996 |
| JP | 10-007493 | 1/1998 |
| JP | 10-251010 | 9/1998 |
| JP | 2000-138385 | 5/2000 |
| JP | 2000-332279 | 11/2000 |
| JP | 2001-048518 | 2/2001 |
| JP | 2002-134410 | 5/2002 |
| JP | 2004-123494 | 4/2004 |
| JP | 2004-214442 | 7/2004 |
| JP | 2004-327578 | 11/2004 |

OTHER PUBLICATIONS

Japanese language office action dated Oct. 20, 2011 and its English language translation for corresponding Japanese application 2007509349.

* cited by examiner

PHOTOVOLTAIC CONVERSION ELEMENT AND MANUFACTURING METHOD THEREFOR, AND PHOTOVOLTAIC CONVERSION MODULE USING SAME

CROSS-REFERENCE TO THE RELATED APPLICATIONS

This application is a national stage of the international application No. PCT/JP2006/305987 filed Mar. 24, 2006, which is also claims benefit of priority under 35 USC §119 to Japanese Patent Application No. 2005-087115 filed Mar. 24, 2005, the entire contents of which are incorporated by reference.

TECHNICAL FIELD

The present invention relates to a photovoltaic conversion element represented by a solar cell and a manufacturing method therefor, and a photovoltaic conversion module using the same.

In the specification, the notation "aEn" denotes a×10$^n$.

BACKGROUND ART

At present, the mainstream products of solar cells are bulk crystalline Si solar cells using a crystalline Si substrate.

FIG. 20 shows a general sectional structure of a bulk crystalline Si solar cell 110 disclosed in Patent Document 1.

An opposite conductivity-type region 104 in which phosphorus (P) atoms are diffused at a high concentration is formed on the light incidence plane side of a p-type bulk region 105 constituting a p-type silicon semiconductor substrate, thereby forming a pn junction between the p-type bulk region and the opposite conductivity-type region. Further, an antireflection film 106 including a silicon nitride film or a silicon oxide film is provided on the side of the light incidence plane.

When light is incident on the light incidence plane, photo-production carriers are produced in a semiconductor region 103 including the opposite conductivity-type region 104, the p-type bulk region 105, and the p+-type region 107. In order to collect the carriers as a current and lead it to an output terminal, surface electrodes (bus bar electrodes 101 and finger electrodes 102) composed of a metal material such as silver as a main component are provided on the light incidence plane side, and a back collecting electrode 108 composed of aluminum or silver and back output electrodes 109 composed of silver are provided on the opposite side.

These electrodes are generally formed by printing and firing Al paste or Ag paste. In this case, the firing conditions including the paste composition and the firing temperature are determined on the basis of the following indexes:

(1) contact characteristic at an electrode/semiconductor interface (ohmic characteristic);

(2) adhesive strength characteristic at an electrode/semiconductor interface (electrode strength characteristic);

(3) resistivity characteristic of an electrode (series resistance characteristic); and (4) pn-junction characteristic (junction recombination current (diode current) characteristic and leakage current characteristic).

In particular, when an electric contact is formed by a process (fire-through process) in which electrode forming metal paste is applied directly on the antireflection film 106 and fired, the paste composition is controlled to conform to the method, and the firing conditions are determined in consideration of:

(5) the fire-through property of the antireflection film.

FIG. 21 is a drawing the surface electrodes as viewed from the light incidence plane (surface) side. In the drawing, reference numeral 101 denotes a bus bar electrode, and reference numeral 102 denotes a finger electrode.

The surface electrodes generally include the finger electrodes 102 (branch electrodes) with a narrow line width and the bus bar electrodes 101 (stem electrodes) with a thick line width to which at least one of the ends of each finger electrode 102 is connected.

In particular, in order to increase as much as possible the effective light receiving area, it is necessary that the surface electrodes are as narrow as possible. However, as the line width decreases, the series resistance value of the surface electrodes generally increases (series resistance loss increases), thereby decreasing the fill factor FF of solar cell characteristics. Therefore, Ag paste containing as a main component Ag having the highest conductivity among metal materials is generally used.

Patent Document 2 discloses the results of measurement of conditions for producing a polycrystalline silicon ingot in order to achieve a high efficiency of energy conversion in consideration of the concentration relations between impurities such as C, O, B, and P.

Patent Document 1: Japanese Unexamined Patent Application Publication No. 8-274356

Patent Document 2: Japanese Unexamined Patent Application Publication No. 10-251010

Patent Document 3: Japanese Unexamined Patent Application Publication No. 2000-332279

Problem to be Solved by the Invention

As described above, in a bulk crystalline Si solar cell, surface electrodes are generally formed by printing and firing Ag paste. However, solar cells undergoing the electrode firing step do not necessarily have sufficient characteristics.

There is also the problem that reproducibility is insufficient, and thus large variation occurs in characteristics of elements even when firing is performed under the same firing conditions.

There is further the problem that it is very difficult to set firing conditions because characteristics greatly vary with small differences in firing conditions, and it is thus difficult to stably realize high yield.

In particular, the fill factor FF characteristic and the open-circuit voltage Voc of a solar cell are significantly affected.

The present invention has been achieved in consideration of the above problems and provides a photovoltaic conversion element having excellent characteristics and a method for easily manufacturing the same in high yield, and a photovoltaic conversion module using the same.

Means for Solving the Problems

The inventors have found that in a depletion region of a crystalline Si semiconductor constituting a pn junction, particularly the oxygen concentration of a region below an electrode is a factor that greatly affects the pn junction characteristics and greatly affects the characteristics and yield of solar cells undergoing the electrode firing step. As a result of repeated experiments on the basis of this finding, the inventors found the following constitution of the present invention:

According to one aspect of the invention, a photovoltaic conversion element includes a one conductivity-type crystalline Si semiconductor, an opposite conductivity-type semiconductor which is joined to the crystalline Si semiconductor to form a pn junction therebetween, an electrode provided on the opposite conductivity-type semiconductor, and a depletion region formed across the pn junction from the side of the conductivity-type crystalline Si semiconductor to the side of the opposite conductivity-type semiconductor, wherein the depletion region has a first depletion region located at the side of the first semiconductor and under the electrode and the first depletion region has an oxygen concentration of 1E18 [atoms/cm$^3$] or less.

The first depletion region at the pn junction represents a region (depleted of majority carriers) in which the majority carrier concentration decreases closer to the intrinsic carrier concentration. Charge transfer occurs so that the Fermi level Efp based on the vacuum level in a p-type region coincides with the Fermi level Efn in a n-type region before the formation of a pn junction, thereby forming depletion regions on both sides of the pn junction (as a result, minus charge and plus charge occur in the p-side depletion region and the n-side depletion region, respectively, thereby producing an electric field E directed from the n-side to the p-side).

When a charge distribution is approximated by a stepwise distribution, the amount of charge transfer satisfies NA×Wp=ND×Wn required by the law of conservation of charge, wherein NA is the doping concentration in a p-type region, ND is the doping concentration in a n-type region, Wp is the thickness of a depletion region formed in a p-type region, and Wn is the thickness of a depletion region formed in a n-type region. In addition, in charge transfer, the diffusion potential formed in the p-type region and the n-type region (=∫E·dx [x=integration in an interval of −Wn to +Wp]: in stepwise approximation, ≈q (ND·Wn$^2$+NA·Wp$^2$)/(2∈) wherein ∈ is the dielectric constant of silicon) is determined so as to coincide with |Efp−Efn|, and the thickness W of the depletion region in the pn junction is W=Wp+Wn.

For example, in an embodiment which will be described below, when NA≈1E16 [atoms/cm$^3$] and ND≈1E19 [atoms/cm$^3$], the thickness W of the depletion region W≈Wp≈0.4 μm (in this case, Wn is sufficiently smaller than Wp and thus can be neglected).

In the photovoltaic conversion element of the one aspect of the present invention, the oxygen concentration in at least the first depletion region is 1E18 [atoms/cm$^3$] or less, and thus an increase in density of the oxygen precipitate produced in electrode firing and the growth of the oxygen precipitate are suppressed. As a result, the occurrence of dislocation and lamination defects in crystalline Si can be suppressed, thereby improving the characteristics of a solar cell.

When the electrode is a fired electrode formed by applying and firing paste containing metal particles, the one aspect of the present invention has more advantages. The reason for this is that since the oxygen concentration in a region below the electrode, which directly undergoes oxygen diffusion accompanying the formation of the fired electrode, is 1E18 [atoms/cm$^3$] or less, the growth of the oxygen precipitate produced in electrode firing can be effectively suppressed.

In the depletion region, a region (second depletion region) not present below the electrode may contain a portion having a higher oxygen concentration than that of the region (first depletion region) below the electrode. Since the electrode is not present above the second depletion region, the influence on the solar cell characteristics is relatively small.

The one conductivity-type crystalline Si semiconductor preferably has a carbon concentration of 3E17 [atoms/cm$^3$] or less in a region at a depth of 10 μm from the pn junction. This is because carbon functions as a nucleus of oxygen precipitation and promotes oxygen precipitation.

According to another aspect of the invention, a first method of manufacturing a photovoltaic conversion element includes preparing a crystalline Si substrate of one conductivity type having a surface layer portion with an oxygen concentration of 2E17 [atoms/cm$^3$], and thermally diffusing an opposite conductivity-type doping element from the surface layer portion of the crystalline Si substrate to form an opposite conductivity-type semiconductor joined to the crystalline Si semiconductor. This method uses the crystalline Si substrate having an oxygen concentration of 2E17 [atoms/cm$^3$] or less, and thus the effect of oxygen diffusion can be suppressed even in thermal diffusion of the opposite conductivity-type doping element from the surface layer portion, thereby suppressing the oxygen concentration of the first depletion region to 1E18 [atoms/cm$^3$] or less after the whole element processing step.

According to another aspect of the invention, a second method of manufacturing a photovoltaic conversion element includes preparing a crystalline Si substrate of one conductivity type, forming a low-oxygen-concentration region with an oxygen concentration of 2E17 [atoms/cm$^3$] or less in a surface layer portion of the crystalline Si substrate, and thermally diffusing an opposite conductivity-type doping element from the surface layer portion of the crystalline Si substrate to form an opposite conductivity-type semiconductor joined to the crystalline Si semiconductor. In this method, the low-oxygen concentration region with an oxygen-concentration of 2E17 [atoms/cm$^3$] or less is formed in the surface layer portion of the crystalline Si substrate before the thermal diffusion step. Therefore, the effect of oxygen diffusion can be suppressed in the thermal diffusion step, thereby suppressing the oxygen concentration of the first depletion region to 1E18 [atoms/cm$^3$] or less after the whole element processing step.

The low-oxygen-concentration region is preferably formed in a thickness of 1.0 μm or more. Since the thickness of a depletion region at a pn junction is generally about 0.4 μm, when the low-oxygen concentration region is formed in a thickness of 1.0 μm or more, the oxygen concentration in the depletion region after the whole element processing step can be securely suppressed to 1E18 [atoms/cm$^3$] or less.

The step of forming the low-oxygen-concentration region may include a heat treatment step of heating the crystalline Si substrate in a reducing atmosphere or a laser recrystallization step of irradiating the surface layer portion of the crystalline Si substrate with a laser beam to melt the surface layer and then recrystallizing the surface layer. Either of the steps can effectively form the low-oxygen-concentration region, thereby easily forming the photovoltaic conversion element of the one aspect of the present invention in high yield.

In the latter laser recrystallization step, a region to be irradiated with a laser beam is preferably a substrate surface layer region which directly undergoes oxygen diffusion accompanying electrode formation and in which an electrode is formed.

As described above, when the low-oxygen concentration region with an oxygen concentration of 2E17 [atoms/cm$^3$] or less is formed in a surface layer portion of the crystalline Si substrate, followed by the thermal diffusion step, an oxygen concentration profile plotted from a starting point at a depth of 10 μm from the pn junction of the manufactured crystalline Si semiconductor to the pn junction has an inflection point at which the profile is convex in the low-concentration direction.

According to another aspect of the invention, a photovoltaic conversion module includes a plurality of the photovoltaic conversion elements which is formed to be electrically connected in series or in parallel, and thus has high characteristics.

The above-described and/or other advantages, characteristics, and effects of the present invention will be made clear from the description of embodiments below with reference to the attached drawings.

Figure 1:
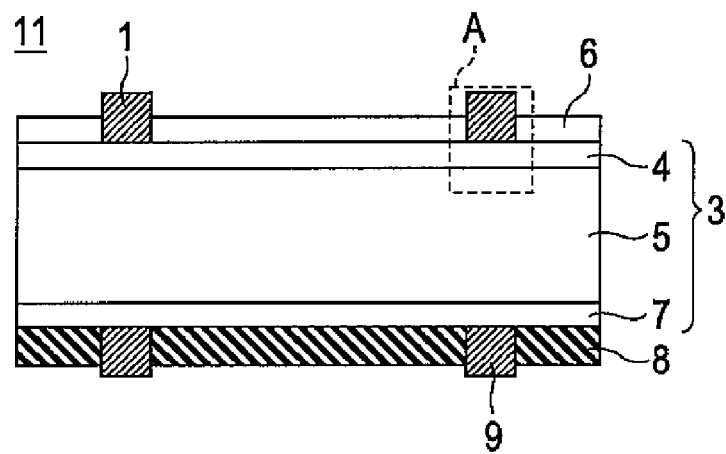
FIG. 1 is a drawing showing an example of a sectional structure of a solar cell element serving as a photovoltaic conversion element according to a first embodiment of the present invention.

| Reference Numerals | |
| --- | --- |
| 1: | surface electrode serving as electrode |
| 1a: | bus bar electrode |
| 1b: | finger electrode |
| 3: | semiconductor region |
| 4: | opposite conductivity-type region (opposite conductivity-type semiconductor) |
| 4a: | depletion region (opposite conductivity-type semiconductor side) |
| 5: | p-type bulk region (crystalline Si semiconductor) |
| 5b: | depletion region (crystalline Si semiconductor side) |
| 5b$_1$: | first depletion region |
| 5b$_2$: | second depletion region |
| 6: | antireflection film |
| 7: | p+-type region |
| 8: | back collecting electrode |
| 9: | back output electrode |
| 10: | depletion region |
| 11: | solar cell element |
| 21, 21a to 21d: | wiring member |
| 22: | transparent member |
| 23: | back protective material |
| 24: | front surface-side filler |
| 25: | back surface-side filler |
| 26: | output extraction wiring |
| 27: | terminal box |
| 28: | frame |
| 101: | bus bar electrode |
| 102: | finger electrode |
| 103: | semiconductor region |
| 104: | opposite conductivity-type region |
| 105: | p-type bulk region |
| 106: | antireflection film |
| 107: | p+-type region |
| 108: | back collecting electrode |
| 109: | back output electrode |
| 110: | solar cell |

DETAILED DESCRIPTION OF THE PREFERRED EMBODIMENTS

Figure 2:
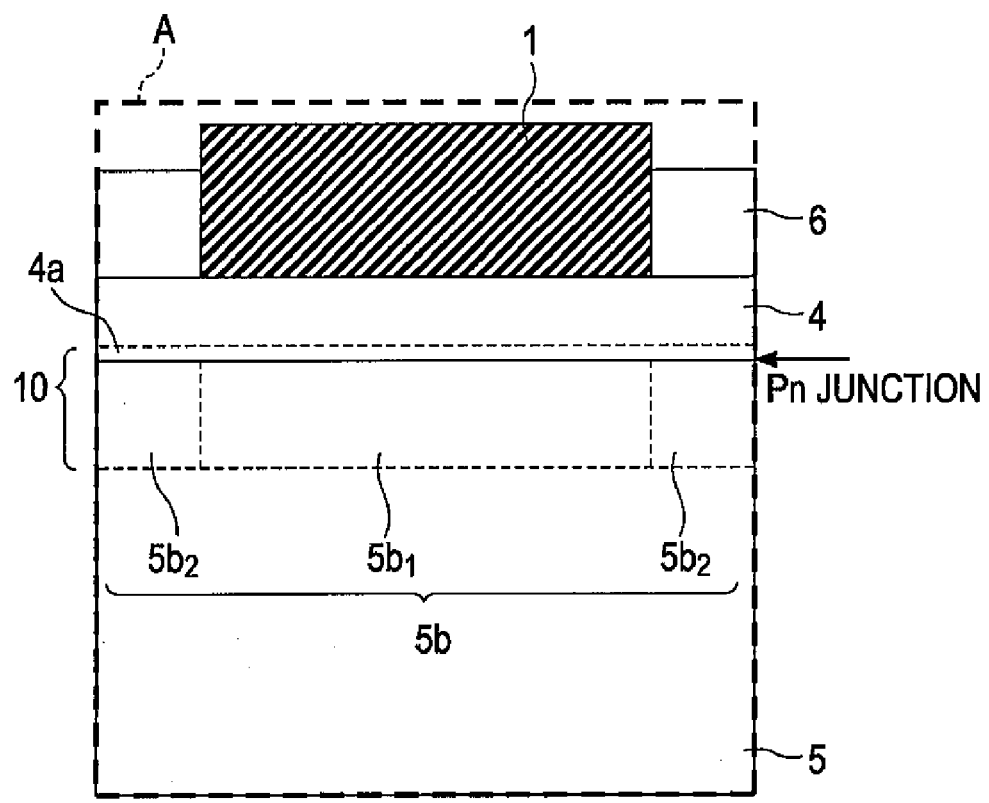
FIG. 2 is a partial enlarged view of the surface electrode/semiconductor pn junction shown in FIG. 1.

FIG. 1 is a drawing showing an example of a sectional structure of a solar cell element serving as a photovoltaic conversion element according to a first embodiment of the present invention. FIG. 2 is a partial enlarged view of a surface electrode/semiconductor pn junction shown in FIG. 1.

Figure 3:
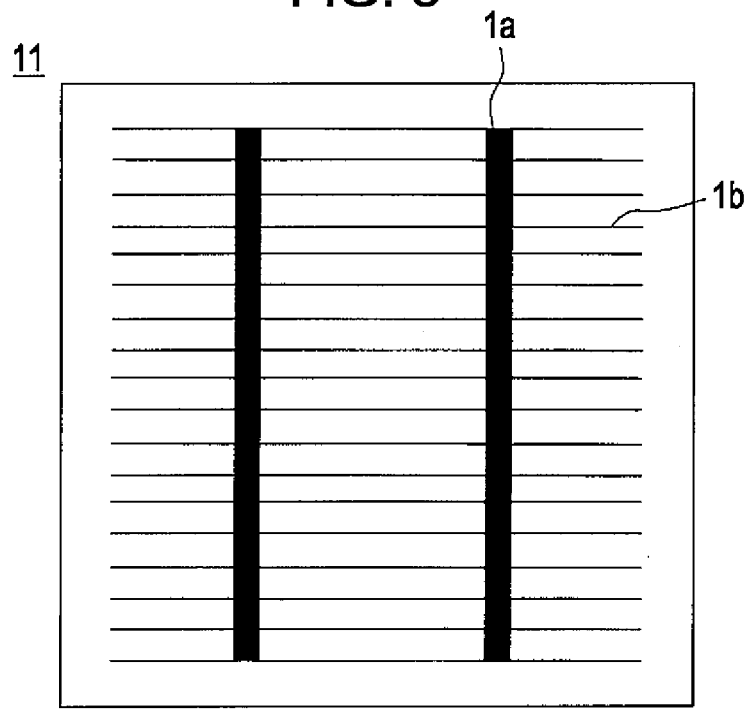
FIG. 3 is a top view of an example of an electrode shape of a solar cell element serving as a photovoltaic conversion element according to the first embodiment of the present invention as viewed from the light-receiving surface side.
Figure 4:
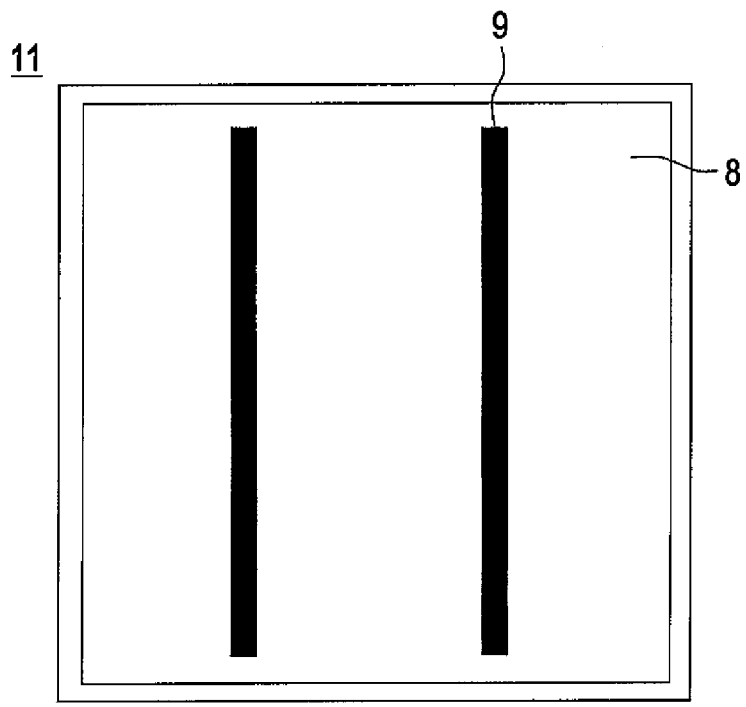
FIG. 4 is a bottom view from the non-light-receiving surface side.

FIGS. 3 and 4 are each a drawing showing an example of an electrode shape of a solar cell element serving as a photovoltaic conversion element according to the first embodiment of the present invention. FIG. 3 is a top view of the solar cell element shown in FIG. 1 as viewed from the light-receiving surface side, and FIG. 4 is a bottom view of the solar cell element shown in FIG. 1 as viewed from the non-light-receiving surface side. The structure will be described in brief below.

As shown in FIG. 1, an opposite conductivity-type region 4 which is made n-type by diffusing a high concentration of P (phosphorus) atoms is formed at the light incidence plane side of a p-type Si substrate including a p-type bulk region 5. The thickness of the opposite conductivity-type region 4 is generally about 0.2 to 0.5 μm. A pn junction is formed between the opposite conductivity-type region 4 and the p-type bulk region.

In addition, an antireflection film 6 composed of a silicon nitride film or a silicon oxide film is provided on the semiconductor on the light incidence plane side. Further, a p+-type region 7 containing a large amount of p-type semiconductor impurities such as aluminum is provided on the side opposite to the light incidence plane side. The p+-type region 7 is referred to as a "BSF (Back Surface Field)" region and functions to decrease the rate of recombination loss caused by photoproduction electron carriers reaching the back collecting electrode 8. As a result, the light current density Jsc is improved. Since the density of minority carriers (electrons) in the p+-type region 7 is decreased, there is the function to decrease the amount of diode current (amount of dark current) in a region where the p+-type region 7 is in contact with the back collecting electrode 8, thereby improving the open-circuit voltage Voc.

Surface electrodes 1 composed of a metal material such as silver as a main component are provided on the light incidence plane side of the Si substrate, and the back collecting electrode 8 composed of aluminum as a main component and the back output electrodes 9 composed of silver as a main component are provided on the back side of the Si substrate.

As shown in FIG. 3, the surface electrodes 1 include bus bar electrodes 1$a$ and finger electrodes 1$b$. Namely, the surface electrodes 1 include the finger electrodes 1$b$ (branch electrodes) with a narrow line width and the bus bar electrodes 1$a$ (stem electrodes) with a thick line width to which at least one end of each finger electrode 1$b$ is connected.

In order to decrease, as much as possible, an electric power loss in the surface electrodes 1, a metal material is used for the surface electrodes 1. In the first embodiment of the present invention, fired electrodes formed by applying and firing paste containing metal particles are preferably used as the surface electrodes 1. The use of the fired electrodes can sufficiently exhibit the effect of the first embodiment of the present invention.

When such fired electrodes are used, mixing and diffusion of an oxygen-containing component such as glass frit in paste and oxygen from a firing atmosphere cannot be avoided in firing, thereby causing a factor adversely affecting an element. The first embodiment of the present invention is aimed at achieving satisfactory element characteristics by controlling substrate conditions and conditions for the element processing step so that even if such an adverse effect factor is present, the influence of the factor can be decreased. Details will be described later.

As the metal material, Ag paste containing silver (Ag) having low resistivity as a main component is preferably used, and the electrodes are generally formed by applying by a screen printing method and then firing.

When light is incident on the antireflection film 6 side which is the light incidence plane side of a solar cell element 11, light is absorbed by a semiconductor region 3 including the opposite conductivity-type region 4, the p-type bulk region 5, and the p+-type region 7 and subjected to photovoltaic conversion to produce electron-hole pairs (electron carriers and hole carriers). The electron carriers and the hole carriers (photoproduction carriers) resulting from photoexcitation produce photoelectromotive force between the substantially linear surface electrodes provided on the front surface of the solar cell element 11 and the back electrodes provided on the back surface. The produced photoproduction carriers are collected by these electrodes and led to an output terminal. Also a dark current flows in the direction opposite to a light current according to the photoelectromotive force.

<Solar Cell Element>

Next, the constitution of the first embodiment of the present invention will be described in further detail. As shown in FIGS. 1 and 2, the solar cell element 11 as the photovoltaic conversion element according to the embodiment includes the p-type bulk region including a one conductivity-type crystalline Si semiconductor, the opposite conductivity-type region 4 of n-type including an opposite conductivity-type semiconductor and being joined to the p-type bulk region 5 to form a pn junction, the surface electrodes 1 provided on the opposite conductivity-type region 4, and a depletion region 10 formed from the p-type bulk region 5 side to the opposite conductivity-type region 4 side across the pn junction formed therebetween.

The depletion region 10 includes a depletion region 4$a$ extending into the opposite conductivity-type region 4 (n-type region) side and a depletion region Sb extending into the p-type bulk region 5 side.

The doping concentration in the opposite conductivity-type region 4 is generally 10 to 1000 times higher than that in the p-type bulk region 5. Therefore, even when the depletion region 10 is formed from the p-type bulk region 5 side to the opposite conductivity-type region 4 side across the pn junction formed therebetween, the depletion region 10 substantially mostly extends into the p-type bulk region 5 side. In other words, the depletion region 5$b$ extending into the p-type bulk region 5 side is considered as the main region in the depletion region 10 (hereinafter, when the depletion region in the pn junction is mentioned without otherwise specified, the depletion region means the depletion region 5$b$ serving as the main portion of the depletion region and extending on the p-type bulk region S side).

When the doping concentration in the p-type bulk region 5 is about 1E16 [atoms/cm$^3$], the thickness of the depletion region 10 is about 0.4 μm. When the doping concentration is higher than this value, the thickness decreases.

The depletion region 5$b$ serving as the main portion of the depletion region and extending on the p-type bulk region side can be divided into a first depletion region 5$b_1$ shadowed by each surface electrode 1, i.e., positioned below each surface electrode 1, and a second depletion region 5$b_2$ other than the first depletion region 5$b_1$ as viewed through from the surface electrodes 1 side.

The first depletion region 5$b_1$ is a region which directly undergoes oxygen diffusion accompanying the formation of the electrodes, and the second depletion region 5$b_2$ is a region on which the electrodes are not provided directly and which undergoes very small oxygen diffusion accompanying the formation of the electrodes.

In this embodiment, the oxygen concentration is 1E18 [atoms/cm$^3$] or less at least in the first depletion region 5$b_1$.

In the above-described constitution in which the oxygen concentration in at least the first depletion region 5$b_1$ is low, it is possible to increase the light current/dark current ratio and improve the characteristics of the solar cell.

When oxygen is present in a predetermined amount or more, the probability of production of oxygen precipitate (SiO$_2$ and the like) produced by heat treatment in the element processing step is rapidly increased to cause strain-stress induction, thereby easily producing dislocation and lamination defects in a crystal. In a fired electrode, oxygen diffuses from glass frits in the electrode firing step to further increase the probability of production of oxygen precipitate, and thermal strain-thermal stress induction in a temperature up and down thermal history causes dislocation and lamination defects in a crystal.

In the first depletion region $5b_1$ below each surface electrode 1, dislocation and lamination defects serve as recombination centers of carriers to increase the recombination current density in the pn junction, thereby degrading quality and decreasing the fill factor PF characteristic and the open-circuit voltage Voc of the solar cell.

The second depletion region $5b_2$ may have a higher oxygen concentration than that in the first depletion region $5b_1$. This is because the first depletion region $5b_1$ is a region below the surface electrodes 1 and thus has the large influence on the solar cell when the oxygen concentration after the formation of the pn junction is 1E18 [atoms/cm$^3$] or less, as compared with the second depletion region $5b_2$.

In order to achieve the above-described constitution, in accordance with a first method, a crystalline Si substrate constituting a main portion. (p-type bulk region 5) of a one conductivity-type crystalline Si semiconductor has an oxygen concentration of 2E17 [atoms/cm$^3$] or less. In this case, even when oxygen diffuses in a device in the element processing step described below, it is possible to easily form the structure of the photovoltaic conversion element of the first embodiment of the present invention in which the oxygen concentration in the first depletion region $5b_1$ is suppressed to 1E18 [atoms/cm$^3$] or less.

In some cases, the oxygen concentration of the crystalline Si substrate is higher than 2E17 [atoms/cm$^3$] or the oxygen concentration is positively increased to be higher than 2E17 [atoms/cm$^3$] for increasing the substrate strength in order to realize thinning of the substrate. In this case, in accordance with a second method, the element after the element processing step has an oxygen concentration higher than 2E17 [atoms/cm$^3$] in a region at a depth of 10 μm from the pn junction, and an oxygen concentration profile plotted from this region as a starting point toward the pn junction has an inflection point at which the profile is convex downward, i.e., toward the low oxygen concentration. The oxygen concentration profile more preferably has a minimum value of 2E17 [atoms/cm$^3$] or less. The method for realizing this will be described in detail below in the description of the element processing step.

The oxygen concentration and the profile thereof can be determined by measuring oxygen concentrations in the depth direction of a sample using SIMS (secondary ion mass spectrometry). In this measurement, Cs+ is used as a primary ion source, and the concentration can be determined by comparison to a standard sample.

<Manufacturing Method for Photovoltaic Conversion Element>

<<A. Step of Preparing P-Type Si Substrate>>

Next, the element processing step in the method for manufacturing the photovoltaic conversion element of the first embodiment of the present invention shown in FIG. 1 will be described.

First, a p-type Si substrate containing the p-type bulk region 5 is prepared as a crystalline Si substrate with one conductivity-type semiconduction. In this case, B (boron) is preferably used as a p-type doping element, and the concentration thereof is about $1\times10^{16}$ to $1\times10^{17}$ [atoms/cm$^3$]. The resistivity of the substrate is about 0.2 to 2 Ω·cm.

The thickness of the Si substrate is 500 μm or less and preferably 350 μm or less. As the Si substrate, a polycrystalline Si substrate formed by slicing a polycrystalline Si ingot cast by a casting method or a single-crystal Si substrate may be used. In particular, a polycrystalline Si substrate capable of sufficiently achieving the effect of the first embodiment of the present invention at low cost is preferably used.

The p-type Si substrate may be doped by adding an appropriate amount of elemental doping element during the production of a silicon ingot or adding an appropriate amount of B-containing silicon slug with a predetermined doping concentration.

As described above, the p-type Si substrate preferably has an oxygen concentration of 2E17 [atoms/cm$^3$] or less.

Figure 5:
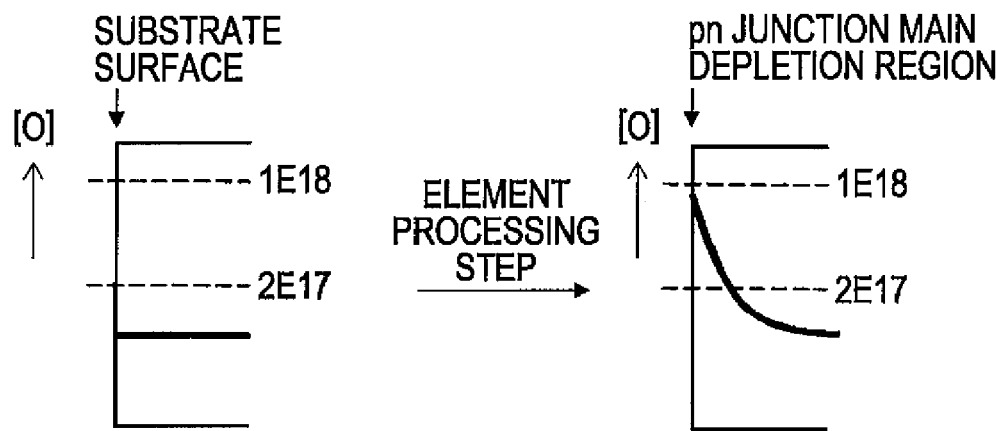
FIG. 5 is a schematic diagram showing oxygen concentration profiles in a p-type Si substrate region before and after an element processing step when the oxygen concentration is lower than 2E17 [atoms/cm$^3$]
Figure 6:
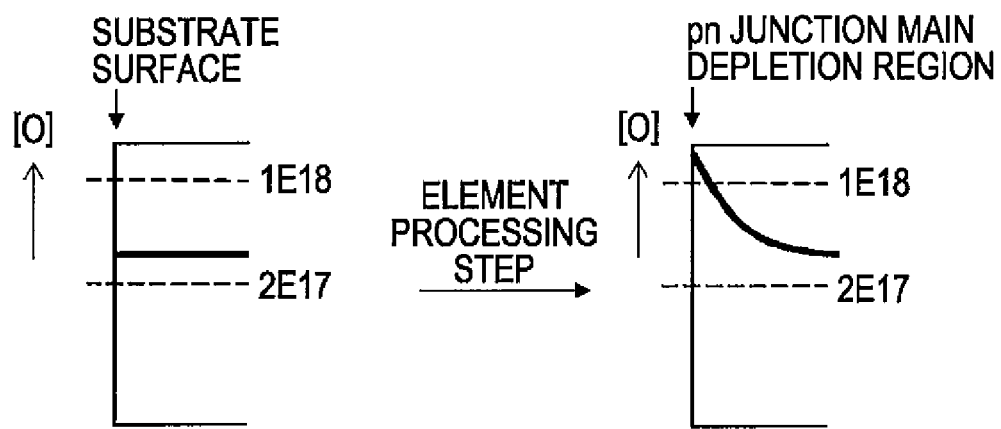
FIG. 6 is a schematic diagram showing oxygen concentration profiles in a p-type Si substrate region before and after an element processing step when the oxygen concentration is higher than 2E17 [atoms/cm$^3$].

FIGS. 5 and 6 are schematic diagrams each showing oxygen concentration profiles in a substrate region before and after the element processing step. FIG. 5 shows oxygen concentration profiles when the oxygen concentration in a p-type Si substrate is 2E17 [atoms/cm$^3$] or less. FIG. 6 shows oxygen concentration profiles when the oxygen concentration in a p-type Si substrate is higher than 2E17 [atoms/cm$^3$]. In each of the diagrams, the profile before the element processing step is shown on the left, and the profile after the element processing step is shown on the right.

In each oxygen concentration profile, the main depletion region in the substrate surface or the pn junction is shown at the left end, and the rightward direction coincides with the inward direction of the substrate. Although, in fact, the oxygen concentration of the substrate does not necessarily takes a constant value, the profile is considered as constant for the sake of simple description. In addition, the opposite conductivity-type region 4 is formed to extend inward from the front surface of the substrate after the element processing step, and thus the actual position where the main depletion region in the pn junction is formed does not coincide with the substrate surface. However, a detailed structure is omitted for the sake of simple description.

As shown in FIG. 5, when the oxygen concentration of the substrate is 2E17 [atoms/cm$^3$] or less, even if there is some degree of influence of oxygen diffusion accompanying thermal diffusion of P in forming the opposite conductivity-type region 4 and oxygen diffusion in forming the electrodes 1 by firing in the element processing step, it is possible to suppress the influence and form the photovoltaic conversion element of the first embodiment of the present invention with stable quality in which the oxygen concentration of the first depletion region $5b_1$ is suppressed to 1E18 [atoms/cm$^3$] or less.

On the other hand, as shown in FIG. 6, when the oxygen concentration of the substrate is higher than 2E17 [atoms/cm$^3$], the oxygen concentration of the first depletion region $5b_1$ possibly exceeds 1E18 [atoms/cm$^3$] after the element processing step.

The inventors found that in order to obtain a polycrystalline Si substrate in which the oxygen concentration is decreased to 2E17 [atoms/cm$^3$] or less, the cast method may be performed as follows.

First, a Si slug is melted to form a Si melt in a quartz crucible, and the Si melt is solidified by pouring into a carbon or quartz mold. At this time, a releasing material containing SiN as a main component is previously applied on the inner wall of the mold. The Si melt in the quartz crucible has a high oxygen concentration exceeding 1E18 [atoms/cm$^3$] (close to the saturation solubility 2E18 [atoms/cm$^3$]) because a large amount of oxygen is dissolved into the Si melt from quartz. When the high-oxygen-concentration Si melt is poured into the mold, solidification proceeds from the bottom of the mold to the top thereof with time. However, as described above, the mold in which the SiN releasing material is applied to the inner wall is used, and thus oxygen dissolution into the Si melt from the mold can be substantially neglected.

Oxygen in the remaining Si melt is removed in the form of SiO gas from the surface of the Si melt so that the oxygen concentration in the Si melt can be gradually decreased with the passage of time. The atmosphere in a casting furnace is an inert gas atmosphere of Ar or an inert gas atmosphere further containing a small amount of reducing gas such as $H_2$, the gas pressure in the furnace is a reduced pressure of 5E3 Pa or less and preferably 3E3 Pa or less, and the Ar gas flow rate is 30 L/min or more and preferably 50 L/min or more. In this case, the above-mentioned effect can be further improved.

When about 80 kg of the Si melt is solidified for about 8 hours, the oxygen concentration in crystal can be decreased to 2E17 [atoms/cm$^3$] or less in a region of 90 to 95% or more of a Si ingot (in a region excluding a region from the ingot bottom at a solidification rate of 0% to a position at a solidification rate of 5 to 10%). In other words, it can be secured that the substrate cut out from this region has an oxygen concentration of 2E17 [atoms/cm$^3$] or less.

The term "solidification rate" corresponds to a position defined along the solidification direction of the ingot. In this embodiment, in solidification from the mold bottom to the head (top) thereof by the cast method, the ingot bottom at which solidification occurs earliest is considered as solidification rate 0%, and the ingot top at which solidification is latest is considered as solidification rate 100%.

When the solidification time is reduced, i.e., the solidification velocity is increased, at the same SiO evaporation rate from the melt, a larger amount of oxygen is taken into the crystal during solidification, and thus the oxygen concentration in the crystal tends to increase. Therefore, when the solidification time is reduced, the Ar gas pressure in the furnace is controlled to be further decreased, and the Ar gas flow rate is controlled to be further increased. If required, the melt state is maintained without solidification for a while after pouring so that SiO evaporation can be promoted to more effectively realize a reduction of oxygen.

Even when the p-type Si substrate has an oxygen concentration higher than 2E17 [atoms/cm$^3$], a low-oxygen-concentration region at an oxygen concentration of 2E17 [atoms/cm$^3$] or less may be formed in the surface layer portion of the substrate in which the pn junction to be formed before the thermal diffusion step for forming the opposite conductivity-type region 4 which will be described below. In this case, when oxygen diffusion occurs in the subsequent element processing step, the oxygen concentration in the first depletion region 5b$_1$ below the surface electrodes 1 can be easily suppressed to 1E18 [atoms/cm$^3$] or less. Therefore, a high-oxygen-concentration substrate which cannot be directly used is made usable, resulting in a significant increase in element yield for substrate production.

However, the carbon concentration in the Si substrate is preferably 3E17 [atoms/cm$^3$] or less (more preferably 1E17 [atoms/cm$^3$] or less in order to comply with thinning of the substrate which will be described below) in a region at a depth of 10 μm from the pn junction. The carbon concentration in the substrate can be measured by SIMS (in a depth profile analysis mode and preferably a bulk analysis mode for increasing analysis sensitivity) before element processing. However, even after element processing, the value in a region at a depth of about 10 μm from the pn junction can be considered as the carbon concentration in the substrate.

The reason why the carbon concentration is preferably low is that carbon functions as a nucleus of oxygen precipitation and promotes oxygen precipitation. The adverse effect of oxygen precipitation has been described above.

In order to control the carbon concentration to a low value, it is important to decrease carbon contamination of the Si melt in the Si melting step and the solidification step. Sources of carbon contamination include ones produced by reaction between the Si melt and CO gas in the melting and solidification atmosphere and ones dissolved in the Si melt from the releasing material applied on the inner wall of the mold. For the former sources, it is effective to decrease the CO gas concentration in the atmosphere or decrease the melting time and the solidification time to decrease the reaction time. For the latter sources, the solvent in the releasing material is previously sufficiently removed. The CO gas in the atmosphere is produced by leakage and reaction of oxygen resulting from leakage and oxygen-containing gas such as SiO gas evaporated to the carbonaceous material in the furnace (a carbon heater and carbonaceous heat insulator or a graphite mold). In order to decrease the CO gas concentration, of course, leakage is decreased. For the CO gas resulting from SiO gas, it is very effective to increase the Ar gas flow rate to increase CO gas exhaustion or dispose a cover capable of cutting off, as much as possible, contact between the Si melt and the atmosphere gas on the melting crucible and the solidification mold. Further, in order to decrease carbon contamination, a dopant such as B is preferably poured into the Si melt as immediately as possible before solidification.

The carbon concentration in the substrate is not changed before and after element processing except in an ultra-surface layer portion (diffusion range). Since diffusion becomes a problem within the range of a region from the surface to a depth of only several μm or less, the carbon concentration measured at a depth of about 10 μm from the surface can be regarded as the concentration of carbon originally present in the substrate.

Even when the oxygen concentration in the Si substrate is higher than 2E17 [atoms/cm$^3$], if the oxygen concentration in the surface layer portion of the substrate can be decreased, it is possible to use a substrate in which the oxygen concentration is positively increased for increasing the substrate strength in order to realize thinning of the substrate, thereby significantly improving element yield.

An example of such a substrate in which the substrate strength is increased by increasing the oxygen concentration is a polycrystalline silicon substrate containing impurity elements which simultaneously satisfy the following inequality relations:

$$[Oi] \geq 2E17 \text{ [atoms/cm}^3\text{]}$$

$$[C] \geq 1E17 \text{ [atoms/cm}^3\text{]}$$

(wherein [C] is the total carbon concentration [atoms/cm$^3$] measured by secondary ion mass spectrometry, [Oi] is the interstitial oxygen concentration measured by Fourier transform infrared spectroscopy, and interstitial oxygen of silicon has a peak near 1106 cm$^{-1}$ and thus the absolute oxygen concentration can be measured by comparison to the peak of a standard sample).

When a predetermined amount or more of interstitial oxygen is present, the strength of the silicon substrate can be increased.

Methods for forming the low-oxygen-concentration region in the surface of the substrate include a method of heating the substrate in a reducing atmosphere (heat treatment process), and a method of irradiating the surface layer portion of the substrate with a laser to melt the surface layer portion and then recrystallizing it (laser recrystallization process). The two methods will be described below.

When the low-oxygen-concentration region with an oxygen concentration of 2E17 [atoms/cm$^3$] or less is formed in the surface layer portion of the substrate by the heat treatment process, a heat treatment may be performed in a reducing atmosphere (e.g., an atmosphere of Ar, $N_2$, or $H_2$, or a gas mixture thereof) at a temperature of 1000° C. to 1200° C. for a treatment time of about 2 minutes to 90 minutes (e.g., specific treatment conditions including 1000° C. and about 45 to 90 minutes or 1200° C. and about 2 to 4 minutes). In this treatment, oxygen can be diffused to the outside to form the low-oxygen-concentration region in the surface layer portion of the substrate. When the low-oxygen-concentration region is desired to be formed to a larger depth, the treatment time may be extended. In order to promote the outward diffusion of oxygen, a hydrogen atmosphere is preferably used as the reducing atmosphere.

When the low-oxygen-concentration region with an oxygen concentration of 2E17 [atoms/cm$^3$] or less is formed in the surface layer portion of the substrate by the laser recrystallization process, for example, the substrate is irradiated with light at a wavelength of 532 nm with a power density of 0.1 to 1 W per spot of 1 mm in diameter at a speed of 10 to 50 cm per second using a YAG laser device. The pulse width is 5 to 10 nanoseconds, and the pulse frequency is 5 to 50 kHz.

Since oxygen is rapidly removed by vaporization in the form of SiO gas from a region melted by laser irradiation, a decrease in oxygen concentration can be more effectively realized than in outward diffusion by the heat treatment method. In addition, the substrate need not be heat-treated at a high temperature, and the treatment time is relatively short. Therefore, the process is advantageous in decreasing the cost.

A region subjected to laser recrystallization is preferably a surface layer region of the substrate which is directly subjected to oxygen diffusion accompanying the formation of the electrodes and in which the surface electrodes 1 are formed. In particular, the regions of both the bus bar electrodes 1a and the finger electrodes 1b are preferred.

When only the region of the bus bar electrodes 1a is irradiated with a laser, some effect can be obtained.

As described above, when the photovoltaic conversion element after the element processing step has an oxygen concentration higher than 2E17 [atoms/cm$^3$] in a region at a depth of 10 μm from the pn junction, an oxygen concentration profile plotted from this region as a starting point toward the pn junction preferably has an inflection point at which the profile is convex in the low concentration direction. The region at a depth of 10 μm from the pn junction represents a region in which a significant change is not observed in the oxygen concentration even after the element processing step. In this region, the oxygen concentration is regarded as the same as that in the crystalline Si substrate (p-type Si substrate) before element processing.

The oxygen concentration profile will be described with reference to FIGS. 7 to 10. FIGS. 7 to 10 are schematic diagrams each showing oxygen concentration profiles in the substrate region before and after the element processing step when the low-oxygen-concentration region is provided.

Any one of FIGS. 7 to 10 shows the oxygen concentration profiles after the low-oxygen-concentration region is formed to a predetermined thickness in the surface layer portion of the substrate by the above-described step of forming the low-oxygen-concentration region (in the drawings, the step is denoted by heat treatment) and after the element processing step when the oxygen concentration in the p-type Si substrate before element processing is higher than 2E17 [atoms/cm$^3$].

In each of the figures, the profile before the low-oxygen-concentration region is formed is shown on the left, the profile after the low-oxygen-concentration region is formed and before the element processing step is shown at the center, and the profile after the element processing step is shown on the right.

Like in FIGS. 5 and 6, in each oxygen concentration profile, the substrate surface or the main depletion region in the pn junction is shown at the left end, and the rightward direction coincides with the inward direction of the substrate. Although, in fact, the oxygen concentration of the substrate does not necessarily takes a constant value, the profile is considered as constant for the sake of simple description. Also, the opposite conductivity-type region 4 is formed to extend inward from the front surface of the substrate after the element processing step, and thus the actual position where the main depletion region in the pn junction is formed does not coincide with the substrate surface. However, a detailed structure is omitted for the sake of simple description.

Figure 7:
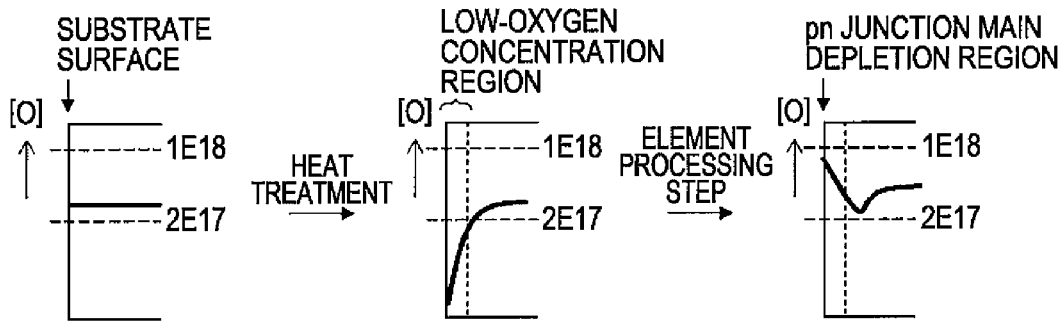
FIG. 7 is a schematic diagram showing oxygen concentration profiles in a substrate region before and after an element processing step when a low-oxygen-concentration region is provided on a substrate surface by heat treatment.
Figure 8:
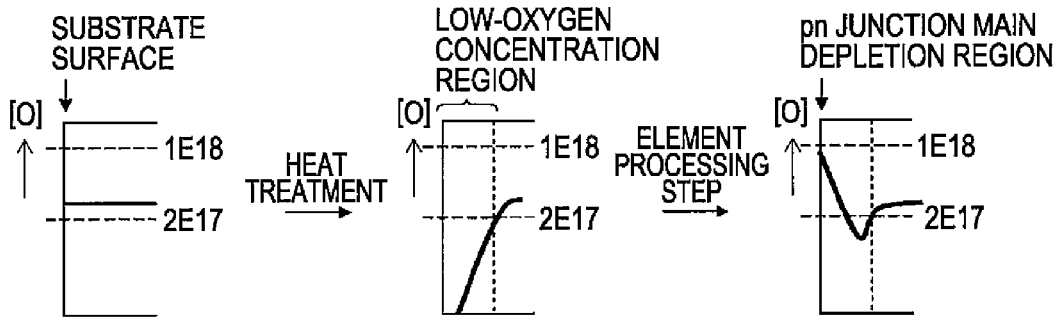
FIG. 8 is a schematic diagram showing oxygen concentration profiles in a substrate region before and after an element processing step when a low-oxygen-concentration region is provided on a substrate surface by heat treatment.
Figure 9:
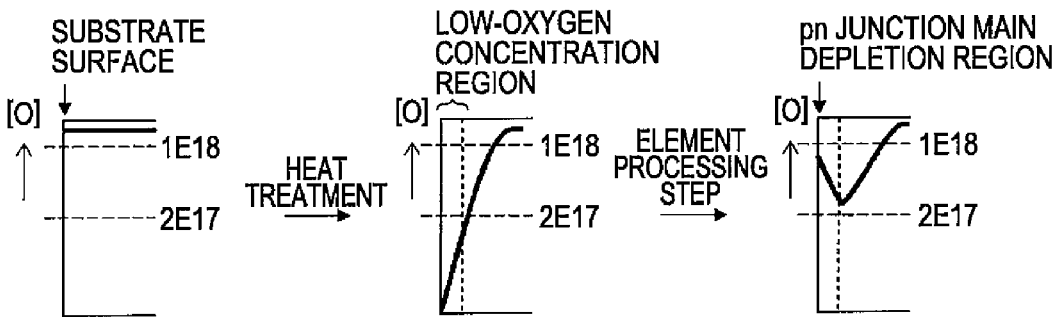
FIG. 9 is a schematic diagram showing oxygen concentration profiles in a substrate region before and after an element processing step when a low-oxygen-concentration region is provided on a substrate surface by heat treatment.

FIGS. 7 and 8 show states of the substrates at the same oxygen concentration, and FIG. 9 shows a state of the substrate at a higher oxygen concentration. FIG. 8 shows a state when the thickness of the low-oxygen-concentration region is larger than that in FIGS. 7 and 9.

In any case, the oxygen concentration increases toward the main depletion region of the pn junction after the element processing step. In addition, the oxygen concentration profile plotted from a region (region at a depth of 10 μm from the pn junction) in which the oxygen concentration is not changed by the element processing step toward the pn junction has a inflection point at which the profile is convex in the low-concentration direction.

Figure 10:
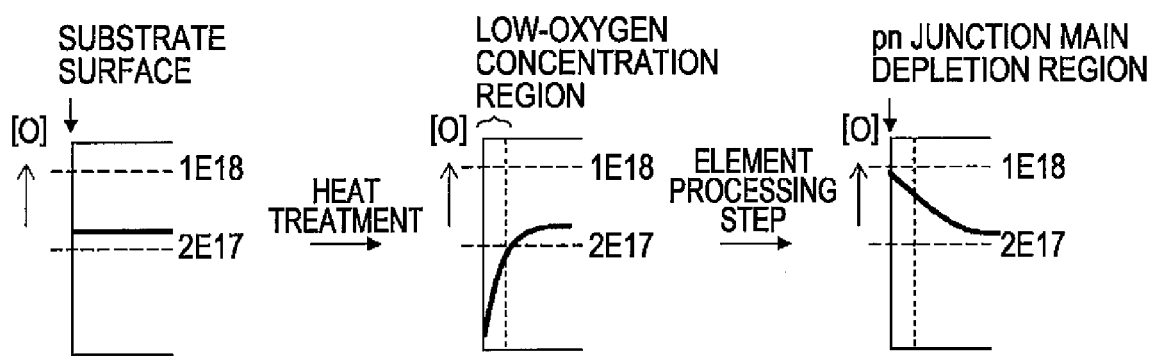
FIG. 10 is a schematic diagram showing oxygen concentration profiles in a substrate region before and after an element processing step when a low-oxygen-concentration region is provided on a substrate surface by heat treatment.

Even when the oxygen concentration of the substrate is equivalent to that in FIGS. 7 and 8, in some cases, the oxygen concentration profile does not have an inflection point at which the profile is convex in the low-concentration direction as shown in FIG. 10.

Such an inflection point tends to be not easily formed when the low-oxygen-concentration region is not sufficiently formed or when oxygen diffusion is excessive in the element processing step (when the temperature of the treatment for forming the opposite conductivity-type region 4 and fired electrodes is high or the number of the treatments is large). Conversely, when such an inflection point is formed, the conditions for forming the low-oxygen-concentration region and the conditions for the element processing step are more appropriate than in the case in which the inflection point is not formed. Therefore, the photovoltaic conversion element can securely exhibit good characteristics.

As shown in FIG. 8, the minimum value of the oxygen concentration profile is preferably 2E17 [atoms/cm$^3$] or less. The minimum value can be controlled to be decreased by increasing the thickness of the low-oxygen concentration region, decreasing the oxygen concentration in the low-oxygen-concentration region, or setting conditions for suppressing oxygen diffusion in the element processing step (decreasing the treatment temperature or the number of treatments). The photovoltaic conversion element in which the minimum value is in this range more securely exhibits the effect of the first embodiment of the present invention, and the yield of characteristics is increased. The minimum value may be at the inflection point as shown in FIG. 8 or a point other than the inflection point.

The low-oxygen-concentration region preferably has a thickness of at least 1.0 μm or more. The opposite conductivity-type region 4 described below is formed by thermally diffusing opposite conductivity-type doping element P in the low-oxygen-concentration region. The opposite conductivity-type region 4 is generally formed in a thickness of about 0.2 to 0.5 μm and forms the pn junction. Since the thickness of the depletion region in the pn junction is about 0.4 μm, when the low-oxygen-concentration region is formed in a thickness of at least 1.0 μm or more, the oxygen concentration in the depletion region 5b on the p-type bulk region 5 side can be securely suppressed to 1E18 [atoms/cm$^3$] or less after the whole element processing step, thereby achieving the constitution of the photovoltaic conversion element.

<<B. Step of Removing Damage Layer and Contaminated Layer>>

In a subsequent step, the surface layer portion on each of the front surface and back surface sides of the substrate is etched by about 10 to 20 μm with NaOH, KOH, or a mixed liquid of hydrofluoric acid and nitric acid in order to remove a mechanically damaged layer and contaminated layer of the substrate surface layer portion accompanying slicing of the substrate, followed by washing with pure water.

<<C. Step of Forming Irregular Structure>>

Next, an irregular structure having the function to decrease reflectance is formed (not shown in the drawings) on the substrate front surface serving as the light incidence plane. In order to form the irregular structure, anisotropic wet etching with an alkali liquid such as NaOH used for removing the surface layer portion of the substrate can be used. However, when the Si substrate is a polycrystalline Si substrate formed by the cast method, it is difficult to uniformly form the satisfactory irregular structure for effectively decreasing reflectance over the whole region of the substrate because the crystal plane orientation in a plane of the substrate randomly varies with crystal grains. Therefore, in such a case, the satisfactory irregular structure can be uniformly and relatively easily formed over the entire region of the substrate by gas etching using, for example, a RIE (Reactive Ion Etching) process (refer to Patent Document 3, etc).

Even when the heat treatment step or laser recrystallization step for forming the low-oxygen-concentration region in the surface layer portion of the substrate is applied after the process for forming the irregular structure, the same effect can be obtained.

<<D. Step of Forming Opposite Conductivity-Type Region>>

Next, the opposite conductivity-type region 4 of n-type is formed. As a n-type doping element, P (phosphorus) of n+ type is preferably used at a doping concentration of about 1E18 to 5E21 [atoms/cm$^3$] and with a sheet resistance of about 30 to 300Ω/□. As a result, the pn junction is formed between the opposite conductivity-type region 4 and the p-type bulk region 5. The pn junction is included in a depletion region 10 including the depletion region 5b extending into the p-type bulk region 5 side and the depletion region 4a extending into the opposite conductivity-type region 4 side.

In a method for forming the pn junction, a doping element (P) is diffused into the surface layer portion of the p-type Si substrate at a temperature of about 700° C. to 1000° C. by a thermal diffusion method using gaseous POCl$_3$ (phosphorus oxychloride) as a diffusion source. The thickness of the diffusion layer is about 0.2 to 0.5 μm. This diffusion layer can be realized by controlling the diffusion temperature and the diffusion time so that a desired doping profile can be formed.

In the thermal diffusion method using POCl$_3$, diffusion of oxygen as well as P cannot be avoided. However, since the oxygen concentration in the substrate surface layer region (at least a region from the substrate surface to about 1 μm) including the depletion region 5b is previously controlled to a predetermined value (2E17 [atoms/cm$^3$]) or less in a substrate state, the oxygen concentration in the depletion region 5b after the element processing step including the pn junction forming step can be controlled to 1E18 [atoms/cm$^3$] or less.

In order to suppress oxygen diffusion as much as possible, it is effective to reduce the diffusion temperature and reduce the diffusion time as much as possible. Since diffusion of P can also be suppressed by decreasing the diffusion temperature and the diffusion time, the sheet resistance of the opposite conductivity-type region 4 is increased. Therefore, the sheet resistance can be used as an index for the degree of oxygen diffusion. In general, the sheet resistance is preferably about 45 to 100Ω/□ and more preferably about 65 to 90Ω/□.

In the usual thermal diffusion method using a gaseous diffusion source, a diffusion region is also formed on the surface on the side opposite to the intended surface, but such a diffusion region may be removed by a subsequent etching step. In this case, the opposite conductivity-type region 4 on the side other than the front surface side of the substrate is removed by etching with a mixed liquid of hydrofluoric acid and nitric acid through a resist film applied on the front surface of the Si substrate, and then the resist film is removed. As described below, when the back p+-type region 7 (BSF region) is formed using aluminum paste, aluminum as a p-type dopant can be diffused at a sufficient concentration to a sufficient depth. Therefore, the influence of the n-type diffusion shallow layer previously formed can be neglected, and the n-type diffusion layer formed on the back side need not be removed.

The method of forming the opposite conductivity-type region 4 is not limited to the thermal diffusion method. For example, an amorphous silicon hydride film or a crystalline silicon film including a microcrystalline Si film may be formed at a substrate temperature of about 400° C. or less using thin film technique and conditions. When the opposite conductivity-type region 4 is formed at a low temperature using the thin film technique in place of the thermal diffusion method, the maximum allowable oxygen concentration in the substrate in a substrate state is up to about 1E18 [atoms/cm$^3$] because oxygen diffusion to the substrate in this process can be neglected.

Even when the heat treatment step or the laser recrystallization step is applied to the surface layer portion of the substrate having an oxygen concentration higher than 1E18 [atoms/cm$^3$], the oxygen concentration may be 1E18 [atoms/cm$^3$] or less within a range in which the depletion region of the pn junction is formed, and the required value of the oxygen concentration in a substrate state before the formation of the pn junction can be significantly relaxed.

When the opposite conductivity-type region 4 is formed by the thin film technique, it is necessary to determine the formation order so that the temperature in a later-stage process is lower in view of the temperature of each of the steps described below.

When the opposite conductivity-type region 4 is formed using an amorphous silicon hydride film, the thickness is 50 nm or less and preferably 20 nm or less, while when the opposite conductivity-type region 4 is formed using a crystalline silicon film, the thickness is 500 nm or less and preferably 200 nm or less. When the opposite conductivity-type region 4 is formed by the thin film technique, in order to improve the characteristics, it is effective to form an i-type silicon region (not shown) to a thickness of 20 nm or less between the p-type bulk region 5 and the opposite conductivity-type region 4.

<<E. Step of Forming Antireflection Film>>

Next, the antireflection film 6 is formed. As a material for the antireflection film 6, a Si$_3$N$_4$ film, a TiO$_2$ film, a SiO$_2$ film, a MgO film, an ITO film, a SnO$_2$ film, and a ZnO film can be used. The thickness may be appropriately selected so as to realize non-reflection conditions for incident light (the optimum thickness of the antireflection film is $(\lambda/n)/4=d$ wherein n is the refractive index of the material, and $\lambda$ is the wavelength in an intended non-reflection spectral region). For example, for a generally used Si$_3$N$_4$ film (n=about 2), when the intended non-reflection wavelength is 600 nm in view of the sunlight spectral characteristics, the thickness may be about 75 nm.

When the antireflection film is formed by a PECVD method, an evaporation method, or a sputtering method, and the pn junction is formed by the thermal diffusion method, the temperature is about 400° C. to 500° C., while when formed by the thin film technique, the temperature is 400° C. or less.

When the surface electrodes 1 are not formed by the fire-through process described below, the antireflection film 6 is formed in a predetermined pattern in order to form the surface electrodes 1. Usable patterning methods include an etching method (wet or dry) using a resist mask and a method including forming a mask in the formation of the antireflection film 6 and then removing the mask after the formation of the antireflection film 6.

On the other hand, in the use of the fire-through process in which an electrode material of the surface electrodes 1 is applied directly on the antireflection film 6 and then baked to electrically connect the surface electrodes 1 and the opposite conductivity-type region 4, the patterning is not required. The Si$_3$N$_4$ film has a surface passivation effect during formation and a bulk passivation effect during subsequent heat treatment, and thus has the effect of improving the electric characteristics of the solar cell element in addition to the antireflective function.

<<F. Step of Forming P+-Type Region>>

Next, the p+-type region 7 (BSF region) is formed. Specifically, an organic vehicle and glass frit are added to aluminum powder in amounts of 10 to 30 parts by weight and 0.1 to 5 parts by weight, respectively, relative to 100 parts by weight of aluminum to form an aluminum paste. The aluminum paste is printed by screen printing, dried, and then heat-treated at 600° C. to 850° C. for about several seconds to several tens of minutes. As a result, aluminum diffuses into the Si substrate to form the p+-type region 7 (BSF region) capable of preventing recombination of the carriers produced on the back of the substrate. The aluminum doping concentration of the p+-type region 7 is about 1E18 to 5E21 [atoms/cm$^3$].

Of the metal component in the paste, the component remaining on the p+-type region 7 unused for forming the p+-type region 7 can be used as a portion of the back collecting electrode 8 serving as a back electrode. In this case, the residual component need not be removed with hydrochloric acid. In the specification, the back collecting electrode 3 is handled as being partially composed of the aluminum remaining on the p+-type region 7 as a main component. However, when the residual aluminum is removed, an alternative electrode material may be formed. As the alternative electrode material, silver paste for the back collecting electrode 8 is preferably used in order to increase the reflectance of long-wavelength light reaching the back surface. As the p-type doping element, B (boron) can also be used.

When the p+-type region 7 is formed by printing and firing, it is not necessary to remove the n-type region formed on the back side of the substrate at the same time as the formation of the opposite conductivity-type region 4 on the front surface of the substrate as described above.

Further, the p+-type region 7 (the back side) can be formed by a thermal diffusion method using gas in place of the printing and firing method. In this case, the region 7 is formed using BBr$_3$ as a diffusion source at a temperature of about 800 to 1100° C. Further, a diffusion barrier such as an oxide film is previously formed on the opposite conductivity-type region 4 (front surface side) which has been previously formed. When the antireflection film 6 is damaged in this step, the step can be performed before the step of forming the antireflection film. The concentration of the doping element is about 1E18 to 5E21 [atoms/cm$^3$]. As a result, a Low-High junction can be formed between the p-type bulk region 5 and the p+-type region 7.

The method of forming the p+-type region 7 is not limited to the printing and firing method and the thermal diffusion method using gas. For example, an amorphous silicon hydride film or a crystalline silicon film containing a microcrystalline Si phase may be formed at a substrate temperature of about 400° C. by the thin film technique. In particular, when the pn junction is formed by the thin film technique, the p+-type region 7 is also formed by the thin film technique. The thickness is about 10 to 200 nm. In order to improve the characteristics, it is effective to form an i-type silicon region (not shown) to a thickness of 20 nm or less between the p+-type region 7 and the p-type bulk region 5. However, when the p+-type region 7 is formed by the thin film technique, it is necessary to determine the formation order so that the temperature in a later-stage process is lower in view of the temperature of each of the processes described below.

<<G. Step of Forming Surface Electrode and Back Output Electrode>>

Next, silver paste is applied on the front and back surfaces of the substrate and then fired to form the surface electrodes 1 and the back output electrodes 9. Specifically, an organic vehicle and glass frit are added to silver powder in amounts of 10 to 30 parts by weight and 0.1 to 5 parts by weight, respectively, relative to 100 parts by weight of silver to form a silver paste. The silver paste is printed by screen printing, dried, and then baked on a printing surface by firing at 600° C. to 800° C. for about several seconds to several minutes. In order to suppress deterioration in characteristics of the pn junction described below, RT (Rapid Thermal) treatment for high-speed (short time) firing using far-infrared light (IR) is preferably used. By using this method, the firing time can be decreased to about several seconds to several tens of seconds or less.

The surface electrodes 1 and the back output electrodes 9 are preferably fired at the same time in view of cost. However, in some cases, firing is preferably performed in two steps in view of the electrode strength characteristic of the back electrodes (for example, the surface electrodes 1 are first printed and fired, and then the back output electrodes 9 are printed and fired). However, in the two-step firing, the characteristics of the pn junction are frequently degraded by the second firing for the reason described below. Therefore, the second firing is preferably performed at as a low temperature as possible for as a short time as possible. If required, low-temperature firing paste prepared for low-temperature firing may be used.

As the electrode forming method other than the printing and firing method, a sputtering method and a vacuum deposition method such as an evaporation method can be used. In particular, in the printing and firing method using paste, the so-called fire-through process can be performed, in which metal-containing paste for the surface electrodes 1 is printed directly on the antireflection film 6 and then fired to form an electric contact between the surface electrodes 1 and the opposite conductivity-type region 4 without patterning of the antireflection film 6. This method is very effective for decreasing the manufacturing cost. The surface electrodes 1 may be formed before the p+-type region 7 is formed on the back side.

Further, in order to increase adhesive strength between the electrodes and the semiconductor region, a small amount of an oxide component such as $TiO_2$ may be contained in the paste used in the printing and firing method, while in the vacuum deposition method, a metal layer containing Ti as a main component may be inserted in the interface between the electrodes and the semiconductor region. For the back electrodes, a metal layer composed of Ti as a main component preferably has a thickness of 5 nm or less in order to suppress a decrease in reflectance due to the insertion of the metal layer. The back collecting electrode 8 is preferably formed over the entire surface of the back side of the substrate in order to increase the reflectance of long-wavelength light reaching the back side.

When the back collecting electrode 8 overlaps the back output electrodes 9 to increase the thickness, cracking or peeling easily occurs. Therefore, after the back output electrodes 9 for extracting output are formed, the back collecting electrode 8 is preferably formed in a conductive state so as not to cover the back output electrodes 9 as much as possible. The formation order of the back output electrodes 9 and the back collecting electrode 8 may be reversed. Instead of the above-described structure, the back electrodes may have a structure including a bus bar portion and a finger portion which are composed of silver as a main component like in the surface electrodes.

Even when the opposite conductivity-type portion 4 and the p+-type region 7 are formed by the thin film technique, the surface electrodes 1, the back collecting electrode 8, and the back output electrodes 9 can be formed by printing, sputtering, or evaporation. However, the step temperature is 400° C. or less in view of damage to thin film layers.

<<H. Step of Forming Solder Region>>

Finally, if required, a solder region (not shown) is formed on the surface electrodes and the back electrodes by solder dip treatment. When solder-less electrodes are formed without using a solder material, the solder dip treatment is omitted.

In the above-described steps, the solar cell element 11 can be formed as the photovoltaic conversion element according to the first embodiment of the present invention.

<Solar Cell Module>

Next, a solar cell module serving as a photovoltaic conversion module according to a second embodiment of the present invention will be described.

Since the solar cell element formed as the photovoltaic conversion element as described above produces only small electric output in the form of one solar cell element, generally a plurality of solar cell elements is electrically connected in series or in parallel to form a solar cell module. Further, a plurality of such solar cell modules is combined so that practical electric output can be extracted. The solar cell module is constructed to include solar cell elements as the photovoltaic conversion elements according to the second embodiment of the present invention, and thus a plurality of photovoltaic conversion elements is electrically connected in series or in parallel to form a photovoltaic conversion module having high characteristics.

Figure 11:
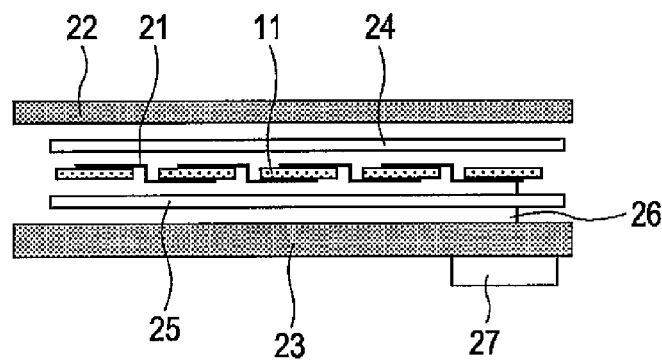
FIG. 11 is a drawing illustrating a sectional structure of a solar cell module.
Figure 12:
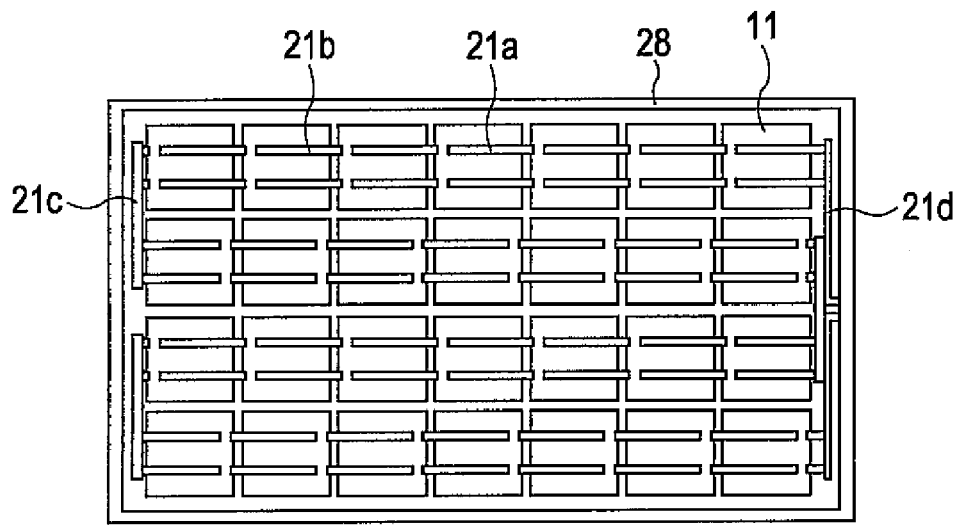
FIG. 12 is a drawing of a solar cell module as viewed from the light-receiving surface side.

FIG. 11 is a drawing showing a sectional structure of a solar cell module, and FIG. 12 is a drawing of the solar cell module shown in FIG. 11 as viewed from the light-receiving surface side.

As shown in FIG. 11, the transparent member 22 composed of glass, the front surface-side filler 24 composed of transparent ethylene-vinyl acetate copolymer (EVA), a plurality of solar cell elements 11, surface electrodes and back electrodes of the adjacent solar elements 11 being connected through the wiring member 21, the back-side filter 25 composed of EVA, and the back protective member 23 including, for example, polyethylene terephthalate (PET) or a metal foil sandwiched between polyvinyl fluoride resin layers (PVF) are laminated in order, degassed in a laminator, heated, and then integrated by pressing to complete the solar cell module. Then, if required, the frame 28 composed of aluminum is provided on the periphery of the solar cell module. Further, ends of the electrodes of the first and last elements of the plurality of elements connected in series are connected to the terminal box 27 serving as an output extracting portion through the output extracting wiring 26.

As the wiring member 21 for connecting the solar cell elements 11, a copper foil having a thickness of about 0.1 to 0.2 mm and a width of about 2 mm is covered with a solder material over the entire surface thereof and then cut into a predetermined length. The wiring member 21 is used by soldering to the electrodes.

As shown in FIG. 12, the solar cell elements 11 are connected, for example, in series through a wiring member 21a to form a solar cell element group. Such solar cell element groups are further connected through wiring members 24b and 24c and a wiring member 24d between an element and the terminal box to form a solar cell module.

The solar cell module according to the second embodiment of the present invention exhibits the effect of the second embodiment of the present invention as long as it contains at least one solar cell element according to the first embodiment of the present invention. However, all solar cell elements are preferably the solar cell elements according to the first embodiment of present invention because the element characteristics can be exhibited to the maximum.

Next, the reason why the above-mentioned excellent effect can be obtained by the constitution of the photovoltaic conversion element of the embodiments will be described in detail together with the results of experiment actually conducted by the inventors.

First, in the constitution of the photovoltaic conversion element of the first embodiment of the present invention (in which the oxygen concentration in the first depletion region $5b_1$ is 1E18 [atoms/cm$^3$] or less), the light current/dark current ratio can be increased to improve the characteristics of the solar cell. The supposed reason for this as follows:

It is defined that a dark current includes a diode current and a leakage current. The diode current mainly includes components resulting from the interface between the surface electrodes and the opposite conductivity-type region 4, the interface between the antireflection film 6 and the opposite conductivity-type region 4, the opposite conductivity-type region 4, the depletion region 10 constituting the pn junction, the p-type bulk region 5, the p+-type region 7, and the interface between the p+-type region and the back electrodes (the back collecting electrode 8 and the back output electrodes 9). The leakage current flows through the depletion region 10 constituting the pn junction.

Since at least a portion of the dark current results from the depletion region 10 constituting the pn junction, the crystal quality of the portion is important. However, in a conventional process for forming a solar cell element, the concentration of oxygen diffusing into the element is not at all taken into consideration. Therefore, particularly in the process accompanied by heating of the element, the oxygen concentration in the depletion region 10 is increased to 1E18 [atoms/cm$^3$] or more.

<Evaluation Result 1>

Figure 13:
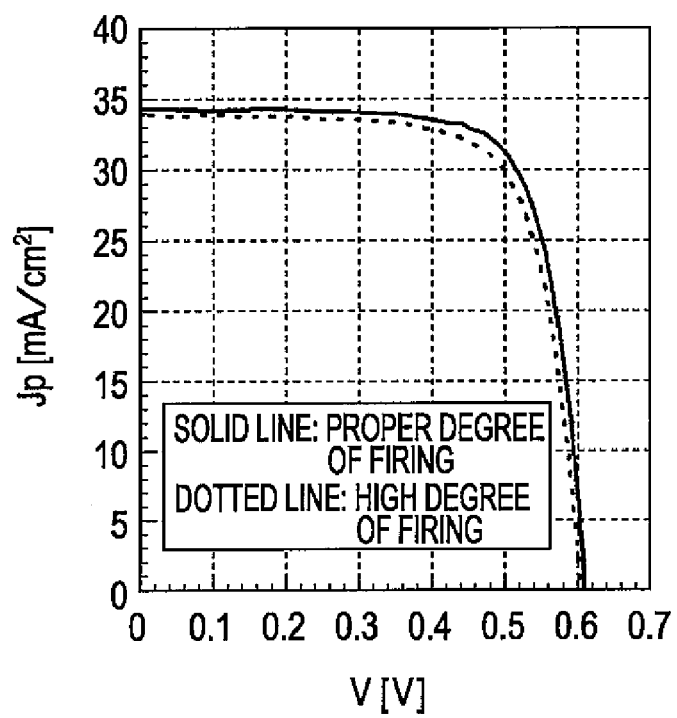
FIG. 13 is a graph showing light V-I curves of solar cells with difference degrees of firing (firing temperature×firing time) in an electrode firing step.
Figure 14:
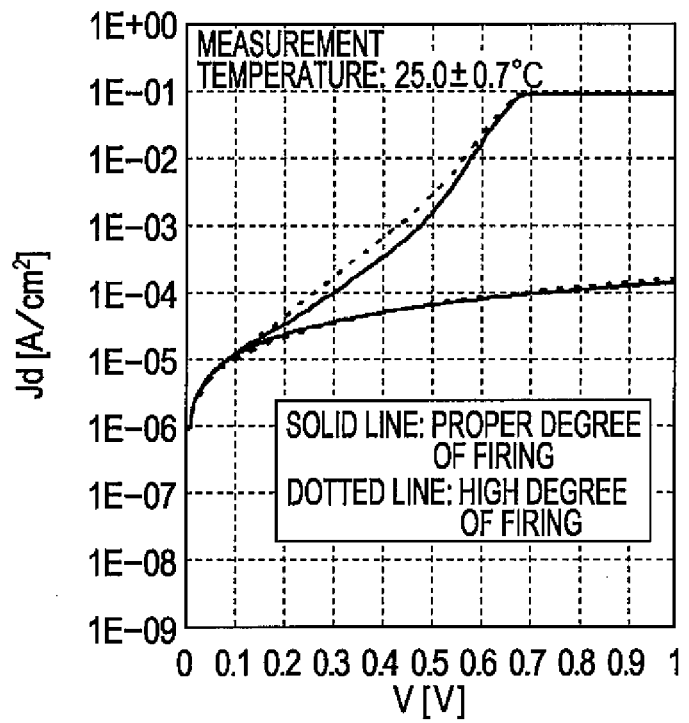
FIG. 14 is a graph showing dark V-I curves of solar cells with difference degrees of firing (firing temperature×firing time) in an electrode firing step.

FIGS. 13 and 14 show light V-I curves and dark V-I curves, respectively, of samples fired in different degrees (firing temperature×firing time) in the electrode firing step. In each of the graphs, the voltage is shown as abscissa, and the current value is shown as ordinate.

FIGS. 13 and 14 indicate that in excessive firing (high degree of firing), FF characteristic and Voc characteristic are degraded. This is possibly due to an increase in recombination current in the pn junction. Since the element characteristics greatly depend on the electrode firing conditions, it is supposed that oxygen precipitation is a problem in the electrode firing step.

The possible reason why the effect of the first embodiment of the present invention can be obtained by decreasing the oxygen concentration is as follows:

Since $POCl_3$ (phosphorus oxychloride) is used as the diffusion source in the P thermal diffusion step for forming the opposite conductivity-type region 4, oxygen mixing and diffusion can occur. In the step of firing the surface electrodes 1, oxygen contained in the glass frit in the metal paste (silver paste) can be mixed and diffused. Also, oxygen can be mixed and diffused from the firing atmosphere.

As described above, the oxygen mixed and diffused in the element processing step contributes to nucleation of oxygen precipitation within the element and further forms precipitates such as a $SiO_2$ phase.

In the oxygen diffusion and heat history in the P thermal diffusion step, a large amount of precipitation nuclei is possibly formed, but the amount of precipitates is not so large (or the size of precipitates is not so large), and thus the characteristics of the element are not degraded in this stage. However, in oxygen diffusion and heat history in the subsequent electrode firing step, precipitates resulting from the oxygen precipitate nuclei and precipitates produced in the P thermal diffusion step are grown, and new precipitation nuclei and precipitates are formed. Therefore, the formation and growth of precipitates possibly proceed to an extent in which the element characteristics are affected according to the firing conditions. In particular, when electrode firing is performed a plurality of times to excessively fire the electrodes, oxygen precipitation proceeds to possibly increase the influence on the element characteristics.

Therefore, strain-stress induction in the formation and growth of oxygen precipitates and thermal strain-thermal stress induction in the temperature up and down heat history in the electrode firing step (e.g., thermal strain occurs due to a difference between the thermal expansion coefficients of a $SiO_2$ phase and a Si phase because the volume expansion in formation of a $SiO_2$ phase is about 2 times) cause dislocation and lamination defects in crystal. Since such dislocation and lamination defects serve as recombination centers for a solar cell element, the recombination current density in the pn junction is increased to degrade quality, thereby possibly decreasing the fill factor FF characteristic and the open-circuit Voc characteristic of the solar cell.

In the photovoltaic conversion element according to the first embodiment of the present invention, the oxygen concentration is 1E18 [atoms/$cm^3$] or less in the first depletion region $5b_1$ which is the depletion region immediately below each electrode and which most easily undergoes oxygen diffusion and mixing.

<Evaluation Result 2>

Figure 15:
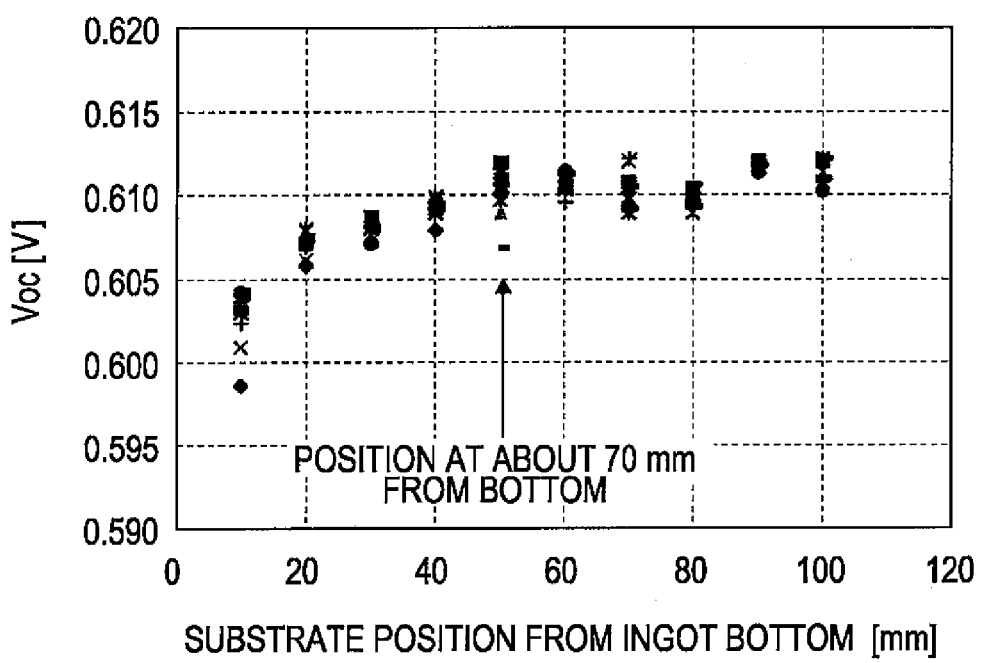
FIG. 15 is a graph illustrating the dependency of the open-circuit voltage Voc of a solar cell on the height from the ingot bottom.
Figure 16:
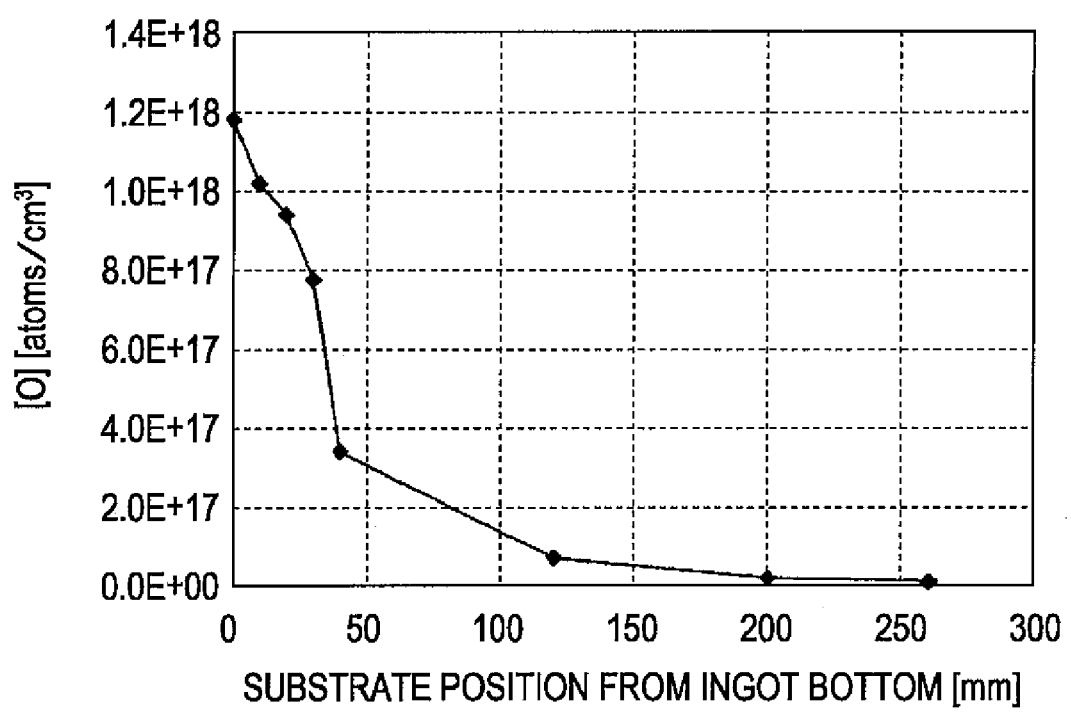
FIG. 16 is a graph showing the dependency of the substrate oxygen concentration on the height from the ingot bottom.
Figure 17:
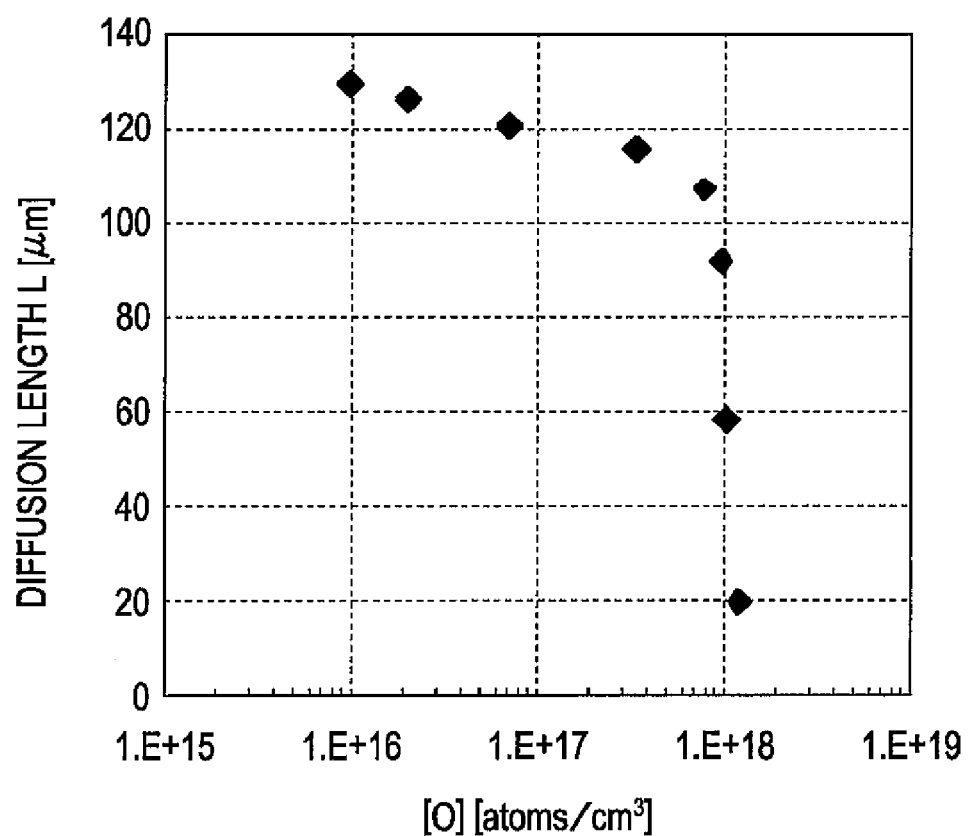
FIG. 17 is a graph showing a relation between the substrate oxygen concentration and quality (minority carrier diffusion length).

FIGS. 15 to 17 show the evaluation results of a polycrystalline Si ingot (cast method).

FIG. 15 is a graph showing the dependency of Voc on the height form the ingot bottom with respect to solar cell elements formed using substrates cut out from different positions from the ingot bottom.

FIG. 16 is a graph showing the dependency of the oxygen concentration (in a substrate state before the element processing step) on the height from the ingot bottom in the same ingot as in FIG. 15.

FIG. 17 is a graph showing the relation between the substrate oxygen concentration (before the element processing step) measured as shown in FIG. 16 and ingot quality (minority carrier diffusion length).

FIG. 15 indicates that the ingot height information and element characteristics have a correlation in which the element characteristic (Voc characteristic) decreases as the position of the substrate in the ingot is closer to the bottom.

FIG. 16 indicates that the oxygen concentration increases as the position of the substrate in the ingot is closer to the bottom. In consideration of these results, it is supposed that a solar cell element formed using a substrate having a high oxygen concentration has lower characteristics.

FIG. 16 also shows that the threshold value of the oxygen concentration in the substrate before the element processing step is 2E17 [atoms/$cm^3$] at an ingot height (about 70 mm or more from the ingot bottom) at which the element characteristic starts to decrease.

FIG. 17 indicates that the oxygen concentration in the substrate and substrate quality (the longer the minority carrier diffusion length, the higher the substrate quality) have a strong correlation. In particular, the figure shows the characteristic that the substrate quality rapidly deteriorates at an oxygen concentration higher than 1E18 [atoms/$cm^3$] as a boundary.

In view of the characteristic of the solar cell element, the threshold oxygen concentration in the crystalline Si substrate before the element processing step is about 2E17 [atoms/$cm^3$]. This concentration is slightly lower than the threshold oxygen concentration of about 1E18 [atoms/$cm^3$] in the crystalline Si substrate before the element processing step in view of the diffusion length characteristic (the value in a substrate state before the element processing step). The inventors thought that the difference between the threshold oxygen concentrations corresponds to oxygen diffusion in the element processing step.

In other words, it is thought that the oxygen concentration in the surface layer portion of the crystalline Si substrate including the pn junction depletion region is increased by oxygen diffusion accompanying P thermal diffusion in formation of the opposite conductivity-type region 4 and oxygen diffusion accompanying firing of the surface electrodes 1, and deterioration in crystal quality rapidly proceeds in a portion having an oxygen concentration of 1E18 [atoms/$cm^3$] or more, thereby causing deterioration in characteristics of the element.

In order to prevent this deterioration, the method for manufacturing the photovoltaic conversion element of the first embodiment of present invention was found.

Namely, on the basis of the above-described finding, it was found that in view of oxygen precipitation in the element processing step, it is necessary that the oxygen concentration in a region including the pn junction depletion region of the crystalline Si substrate before the element processing step is 2E17 [atoms/$cm^3$] or less which is lower than 1E18 [atoms/$cm^3$].

Specifically, (a) the crystalline Si substrate with an oxygen concentration of 2E17 [atoms/$cm^3$] or less is used or (b) the low-oxygen-concentration region (2E17 [atoms/$cm^3$] or less)

is formed in the surface layer portion of the crystalline Si substrate before the heat diffusion step, for forming the low-oxygen-concentration region with an oxygen concentration of 2E17 [atoms/cm$^3$] or less in the surface layer portion which becomes the main depletion region of the pn junction depletion region after the element processing step. In this case, the influence of oxygen diffusion accompanying P thermal diffusion when the opposite conductivity-type region is formed in the element processing step and oxygen diffusion accompanying firing of the surface electrodes can be suppressed to form the photovoltaic conversion element of the first embodiment of the present invention having stable quality.

The low-oxygen-concentration region may be formed by, for example, (b1) heat-treating the crystalline Si substrate in a reducing atmosphere or (b2) irradiating the surface layer portion of the crystalline Si substrate with a laser to melt the surface layer portion and then recrystallizing it before the thermal diffusion step.

In the profile shown in FIG. 16, the oxygen concentration of the polycrystalline Si substrate decreases from the ingot bottom to the head thereof. This is due to the cast method used.

Namely, in the cast method, a Si slug is melted to form a Si melt in a quartz crucible, and the Si melt is solidified by pouring into a mold. The Si melt in the quartz crucible has a very high oxygen concentration exceeding 1E18 [atoms/cm$^3$] (close to the saturation solubility 2E18 [atoms/cm$^3$]) because a large amount of oxygen is dissolved into the Si melt from quartz. When the high-oxygen-concentration Si melt is poured into the mold, solidification proceeds from the bottom of the mold to the top thereof with time. However, the releasing material containing SiN as a main component is generally applied on the inner wall of the mold, and thus oxygen dissolution into the Si melt from the mold can be substantially neglected. Also, oxygen in the Si melt is rapidly removed in the form of SiO gas from the surface of the Si melt, and thus the oxygen concentration in the Si melt gradually decreases with the passage of time. Therefore, the oxygen concentration in the crystalline Si ingot shows a profile in which the concentration more decreases in the latter half of solidification as shown in FIG. 16.

In order to sufficiently vaporize SiO gas, it is preferred to perform casting under reduced gas pressure in the furnace and in a reducing gas atmosphere or an inert gas atmosphere.

The present invention is not limited to the above-described embodiment, and, of course, various modifications can be made in the scope of the gist of the present invention.

For example, although the solar cell using the p-type Si substrate is described above, the use of an n-type Si substrate can exhibit the effect of the first embodiment of the present invention through the same steps as described above except that the polarities are reversed.

Further, the heat treatment step and the laser recrystallization step may be combined for achieving higher element characteristics. The conditions of laser irradiation, such as the wavelength, power, irradiation rate, and irradiation time, are not limited to the above-described conditions as long as the surface layer portion of the substrate can be melted.

Although the above description relates to a single junction, the present invention can be applied to a multi-junction type formed by laminating a thin film junction layer including a semiconductor multilayer film on a junction element using a bulk substrate.

Although, in the above description, the polycrystalline Si substrate formed by the cast method is used as an example of the crystalline Si semiconductor, the production method of the substrate is not limited to the cast method, and the substrate is not limited to the polycrystalline Si substrate. Also, the substrate is not limited to the substrate-shaped crystalline Si, and the present invention can be applied to general thin film-formed crystal Si films.

Although the above description relates to the bulk silicon solar cell as an example, the present invention is not limited to this, and any form can be used within the scope of the principle and object of the present invention. Namely, the present invention can be generally applied to a photovoltaic conversion element including a pn junction and crystalline Si having a light incidence plane as a constituent component, i.e., a photovoltaic conversion element such as a photosensor other than a solar cell, in which photoproduction carriers produced in the semiconductor region by light irradiation of the light incidence plane are collected as an electric current.

EXAMPLE 1

Description will be made of the experimental results of measurement of a relation between the pn junction oxygen concentration and characteristic of the surface electrodes 1 in a bulk polycrystalline Si solar cell element formed as the photovoltaic conversion element of the present invention according to the above-described embodiment.

The main conditions for forming the element are as follows: A plate-shaped B-doped p-type polycrystalline Si substrate produced by the cast method and having a resistivity of about 2 Ω·cm, a thickness of about 300 μm, and a size of 150 mm×155 mm was used as the crystalline Si substrate.

The opposite conductivity-type region 4 was formed by the thermal diffusion method using POCl$_3$ as a diffusion source so that the sheet resistance was 65Ω/□. The surface electrodes 1 were formed by the printing and firing method using Ag paste containing Ag as a main component. The firing was performed by RT treatment using an IR furnace, and the fire-through process was applied. The surface electrodes 1 was formed in a pattern in which two bus bar electrodes 1a with a width of 2 mm were arranged in parallel to the direction of the 155-mm side of the substrate, and 63 finger electrodes 1b with a width of 100 μm were arranged in parallel to the direction of the 150-mm side of the substrate.

As basic conditions for the manufacturing method of the present invention, in the cast method, removal of SiO gas from a Si melt was sufficiently accelerated to prepare a p-type polycrystalline silicon ingot having an oxygen concentration of 1.9E17 [atoms/cm$^3$]. Then, the silicon ingot was sliced to a substrate used for forming a sample of the present invention.

A conventional sample was formed by the same method except that a p-type polycrystalline Si substrate prepared without consideration of removal of oxygen from a Si melt was used. The oxygen concentration of the crystalline Si substrate used for preparing the conventional sample was 2.2E17 [atoms/cm$^3$].

Each of the samples of the photovoltaic conversion elements formed as described above was evaluated with respect to the characteristics such as the open-circuit voltage Voc and the fill factor FF as a solar cell element by the method for measuring crystalline solar cell output defined in JIS C8913 (1998).

As a result, the conventional sample showed Voc of 0.606V and FF of 0.720, while the sample for the manufacturing method of the present invention showed Voc of 0.618V and FF of 0.745 and thus showed more excellent element characteristics.

Next, the oxygen concentration in a crystalline Si region of each of the two solar cell elements of the sample of the present invention and the conventional sample was analyzed by SIMS in the depth direction within a range including the pn junction at a position below the surface electrodes 1 (the bus bar electrodes 1a).

Figure 18:
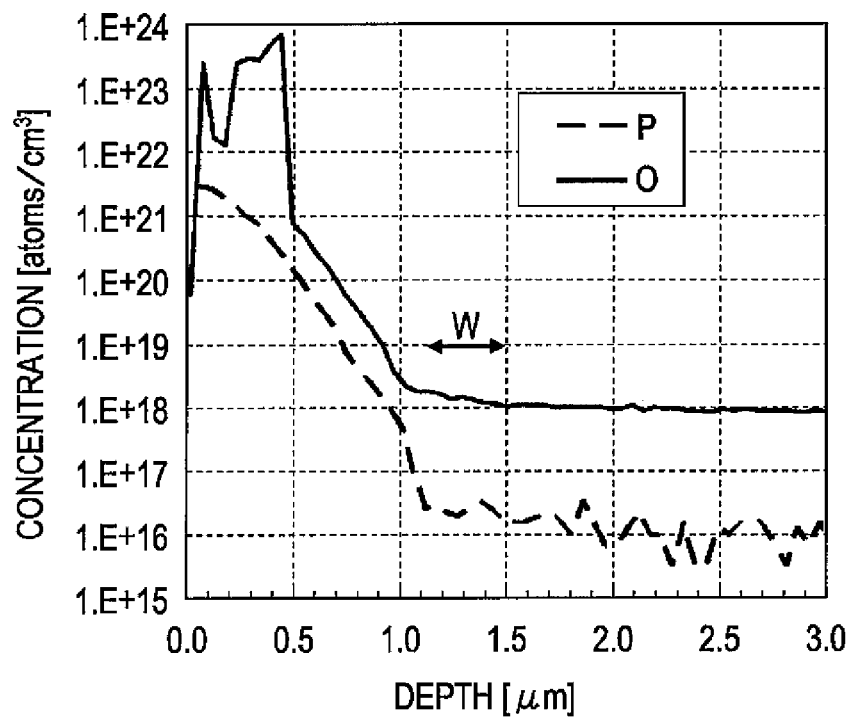
FIG. 18 is a graph showing a profile result of SIMS analysis of oxygen concentrations in a crystalline Si region in the depth direction within a region including a pn junction at a position below a surface electrode in a solar cell element of a comparative example.
Figure 19:
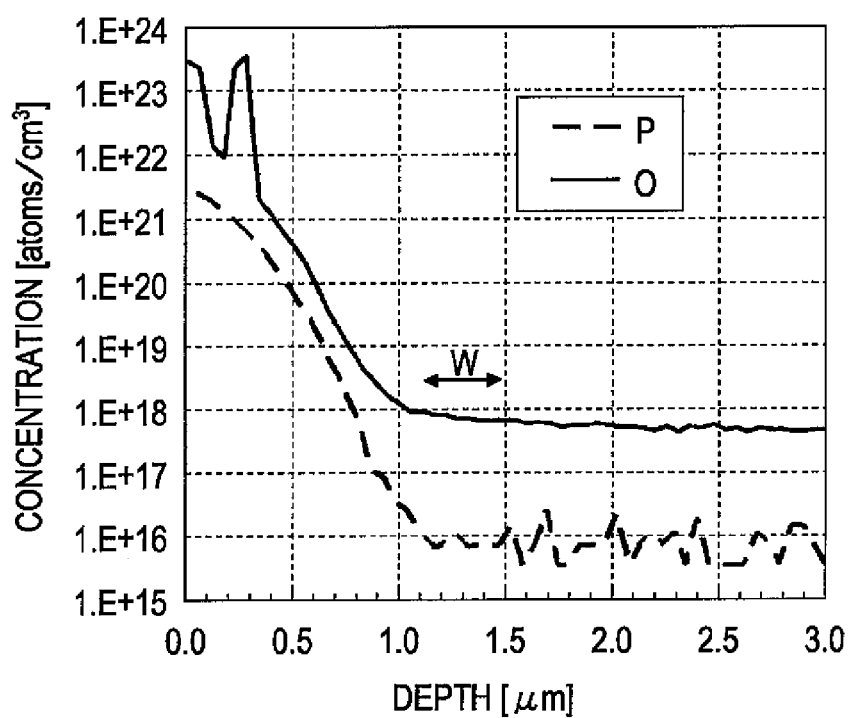
FIG. 19 is a graph showing a profile result of SIMS analysis of oxygen concentrations in a crystalline Si region in the depth direction within a region including a pn junction at a position below a surface electrode in a solar cell element of an example.
Figure 20:
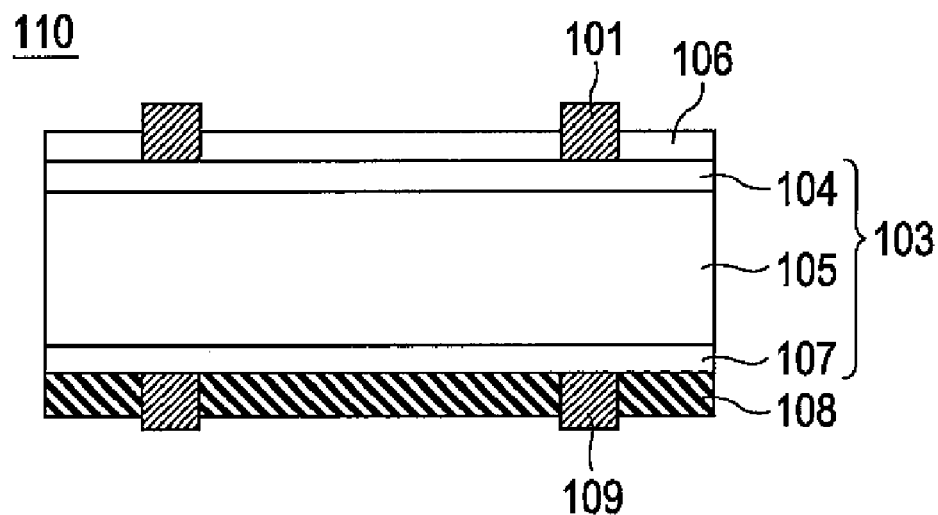
FIG. 20 is a drawing showing a sectional structure of a general bulk crystalline Si solar cell.
Figure 21:
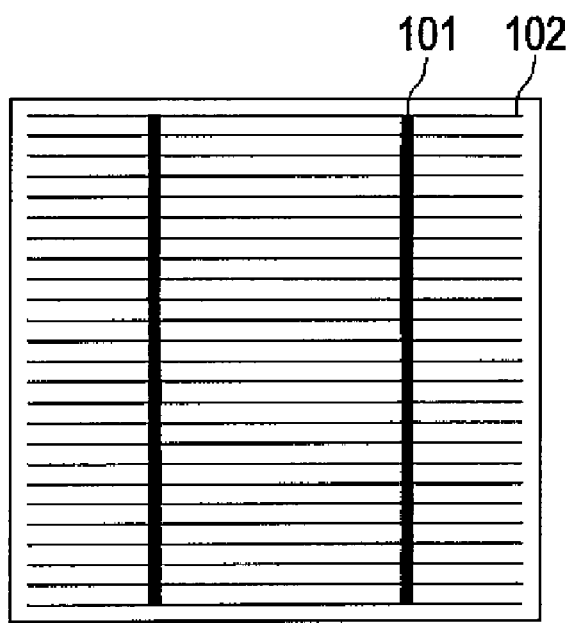
FIG. 21 is a drawing illustrating surface electrodes of a general bulk crystalline Si solar cell as viewed from the light incidence plane side.

FIGS. 18 and 19 show the oxygen concentration profiles of the analytical results. FIG. 18 shows the results of the conventional sample, and FIG. 19 shows the results of the sample of the present invention.

SIMS is a method in which a sample is irradiated, in a vacuum, with an accelerated primary ion beam (oxygen or cesium, but in this example, Cs was used) condensed slenderly, and secondary ions of the particles emitted from a sample surface by sputtering are drown out by an electric field and subjected to mass spectrometry. An absolute concentration can be calibrated by comparison with standard samples. The measurement conditions in this example were as follows:
Apparatus used: Cameca IMS-4f
Primary ion species: Cs+
Primary ion acceleration voltage: 14.5 kV
Primary ion current: 1200 nA
Raster region: 125 μm
Analysis region: 30 μm in diameter
Measurement vacuum degree: 1E-7

SIMS analysis includes a depth profile analysis mode and a bulk analysis mode. Of course, the former mode is used for obtaining a depth profile (concentration analysis in the depth direction) of impurities, while only the average impurity concentration in a substrate can be measured by any one of the analysis modes. However, when the analysis sensitivity must be increased, for example, when the impurity concentration is very low, the bulk analysis mode is particularly preferred.

After the electrodes (bus bar electrodes $1a$) were removed from a measurement portion using aqua regia, each of the samples was cut into a predetermined size with a laser and subjected to SIMS measurement.

In each of FIGS. 18 and 19, a region shown by "W" represents a depletion region width estimated from the P profile and the B concentration in the substrate.

Since the SIMS data shown in the figures were obtained by analysis in an element state with surface irregularity, the concentration profiles contain the influence of the irregularity. Namely, the depth is only a rough value, not an actual value, and the concentration value is an average including some extent of depth information. Therefore, a P profile is used as an indication for defining the junction depth. In other words, the depth at which the P concentration value equals to the B concentration value of about 1E16 [atoms/cm$^3$] is defined as the pn junction depth, and the depletion region possibly extends with a width of W from this position in the inward direction of the substrate. It is thought that the actual junction depth is slightly shallower than the above-defined depth. Therefore, if the oxygen concentration in the region shown by width W falls in the range specified for the oxygen concentration in the first depletion region $5b_1$ of the present invention, the sample can be decided as the photovoltaic conversion element of the present invention.

It is confirmed from FIG. 18 that in the conventional sample, the oxygen concentration in the first depletion region $5b_1$ below the electrodes exceeds 1E18 [atoms/cm$^3$] and is thus out of the range of the photovoltaic conversion element of the present invention. It is supposed that in the conventional sample, the quality of the pn junction is degraded by oxygen precipitation in this region to decrease Voc.

On the other hand, it is confirmed from FIG. 19 that in the sample of the present invention, the oxygen concentration in the first depletion region $5b_1$ below the electrodes is 1E18 [atoms/cm$^3$] or less and is thus within the range of the photovoltaic conversion element of the present invention.

EXAMPLE 2

A sample of a solar cell element was formed and evaluated by the same method as in Example 1 except that in preparing a polycrystalline silicon ingot by the cast method, the oxygen concentration of a crystal Si substrate before element processing was changed by controlling the degassing time of SiO gas from the surface of a Si melt.

The results are shown in Table 1.

TABLE 1

|   | Oxygen concentration in substrate [atoms/cm$^3$] | Oxygen concentration in first depletion region [atoms/cm$^3$] | Efficiency [%] | Isc [A] | Voc [V] | FF | Yield [%] |
|---|---|---|---|---|---|---|---|
|   | 1.2E18 | 1 to 2.0E18 | 15.30 | 7.859 | 0.602 | 0.752 | 87 |
|   | 1.0E18 | 1 to 1.8E18 | 15.46 | 7.862 | 0.607 | 0.753 | 91 |
|   | 8E17 | 1 to 1.6E18 | 15.57 | 7.905 | 0.608 | 0.753 | 93 |
|   | 4E17 | 0.9 to 1.1E18 | 15.72 | 7.951 | 0.609 | 0.755 | 95 |
| * | 2E17 | ≦9E17 | 15.90 | 7.996 | 0.611 | 0.761 | 98 |
| * | 8E16 | ≦8E17 | 16.02 | 7.998 | 0.611 | 0.762 | 98 |
| * | 2E16 | ≦7E17 | 16.02 | 8.002 | 0.611 | 0.762 | 98 |
| * | 1E16 | ≦7E17 | 16.05 | 8.003 | 0.611 | 0.763 | 98 |

* Samples within the range of the present invention.

It is confirmed from Table 1 that when the crystalline Si substrate having an oxygen concentration of 2E17 [atoms/cm$^3$] or less is used, the oxygen concentration in the first depletion region $5b_1$ which is easily affected by oxygen diffusion, particularly, in the electrode firing step can be suppressed to 1E18 [atoms/cm$^3$] or less, thereby producing a solar cell element with high characteristics and high yield.

EXAMPLE 3

The heat treatment step or the laser recrystallization step in the method for manufacturing the photovoltaic conversion element of the present invention was applied to a crystalline Si substrate having an oxygen concentration exceeding 2E17 [atoms/cm$^3$] before element processing to form a low-oxygen-concentration region according to the present invention, followed by element processing.

The oxygen concentration of the crystalline Si substrate before element processing was kept at 4E17 [atoms/cm$^3$].

The conditions for the heat treatment step and the laser recrystallization step were as follows:
[Heat Treatment Step]

The substrate was heat-treated at 1200° C. for 4 minutes at maximum in a hydrogen atmosphere to diffuse oxygen in the substrate to the outside and form a region having an oxygen concentration of 2E17 [atoms/cm$^3$] or less to a depth of about 1.5 μm at maximum (under the conditions of 1200° C. and 4 minutes) from the substrate surface.

The depth was determined from a SIMS profile of a flat substrate prepared separately and heat-treated by the same method as the above.

[Laser Recrystallization Step]

The substrate was irradiated with light at a wavelength of 532 nm using a YAG laser device.

The irradiation conditions were controlled so as to melt to a depth of at least about 2 μm from the substrate surface. Specifically, the substrate was irradiated with a power density of 0.1 to 10 W per spot of 1 mm in diameter at a moving speed of 10 to 50 cm per second. The pulse width was 5 to 10 nanoseconds, and the pulse frequency was 5 to 50 kHz. The laser scan region was the region in which the bus bar electrodes $1a$ of the surface electrodes 1 were formed. The atmosphere of laser treatment was a mixed gas atmosphere containing hydrogen gas and nitrogen gas.

The surface of the substrate was melted and recrystallized by the above-described laser irradiation.

The subsequent element processing step was the completely the same as in Example 1. Then, samples of the solar cell element were formed and evaluated.

For comparison, a sample was formed using a substrate having the same oxygen concentration without heat treatment and laser recrystallization and then evaluated by the same method. The results are shown in Table 2.

TABLE 2

| Substrate pre-treatment condition | Heat treatment condition | Oxygen concentration in first depletion region [atoms/cm$^3$] | Inflection point | Minimum oxygen concentration [atoms/cm$^3$] | Efficiency [%] | Isc [A] | Voc [V] | FF |
|---|---|---|---|---|---|---|---|---|
| No treatment | No | 1E18 to 2E18 | No | 4E17 | 15.72 | 7.951 | 0.609 | 0.755 |
| Heat treatment | 1200° C. 1 min. | 1E18 to 2E18 | No | 4E17 | 15.73 | 7.945 | 0.609 | 0.756 |
| Heat treatment | 1200° C. 2 min. | ≦1E18 * | Present | 3.4E17 | 15.80 | 7.944 | 0.610 | 0.758 |
| Heat treatment | 1200° C. 4 min. | ≦9E17 * | Present | 1.8E17 | 15.95 | 7.942 | 0.612 | 0.763 |
| Laser recrystallization | No | ≦9E17 * | Present | 1.4E17 | 15.91 | 7.955 | 0.611 | 0.761 |

* Samples within the range of the present invention.

Table 2 indicates that when the low-oxygen-concentration region of the present invention was formed by the heat treatment step or the laser recrystallization step, the following results were obtained.

Of the samples undergoing the heat treatment step, the sample subjected to the heat treatment under the conditions of 1200° C. and 4 minutes showed the best element characteristics (efficiency, etc.) in SIMS measurement (under the condition in which the surface had irregularity) of the oxygen concentration below the bus bar electrodes $1a$ after element processing.

Namely, in the resulting oxygen concentration profile (substantially the same as in FIG. 8), in a region inwardly extending to a depth of about 1 to 1.5 μm (rough value because it was determined by SIMS analysis in an irregular element state) from the surface layer, the oxygen concentration is kept at 1E18 [atoms/cm$^3$] or less in a portion corresponding to the main portion of the pn junction depletion region and gradually decreases to the minimum in the inward direction of the substrate, and in a region deeper than this depth, the oxygen concentration tends to gradually increase in the inward direction of the substrate and finally becomes constant at about 4E17 [atoms/cm$^3$] in a region at a depth of 10 μm from the pn junction. The minimum oxygen concentration was 2E17 [atoms/cm$^3$] or less (1.8E17 [atoms/cm$^3$]).

In the sample undergoing the laser recrystallization step, the SIMS measurement of the oxygen concentration below the bus bar electrodes $1a$ after element processing showed the same result as that of the sample undergoing the heat treatment step. Namely, in the resulting oxygen concentration profile (substantially the same as in FIG. 8), in a region inwardly extending to a depth of about 1 to 1.5 μm (rough value because it was determined by SIMS analysis in an irregular element state) from the surface layer, the oxygen concentration is kept at 1E18 [atoms/cm$^3$] or less in a portion corresponding to the main portion of the pn junction depletion region and gradually decreases to the minimum in the inward direction of the substrate, and in a region deeper than this depth, the oxygen concentration tends to gradually increase in the inward direction of the substrate and finally becomes constant at about 4E17 [atoms/cm$^3$] in a region at a depth of 10 μm from the pn junction. The minimum oxygen concentration was 2E17 [atoms/cm$^3$] or less (1.4E17 [atoms/cm$^3$]).

A portion (a semiconductor region below a SiN film) not undergoing laser recrystallization showed an oxygen concentration profile (not shown) in which the oxygen concentration gradually decreases from about 1.2E18 [atoms/cm$^3$] to 4E17 [atoms/cm$^3$] in the depth direction from the surface layer of the crystalline Si substrate.

EXAMPLE 4

In forming a polycrystalline silicon ingot by the same cast method as in Example 1, the oxygen concentration in the crystalline Si substrate before element processing was controlled to 2.5E17 [atoms/cm$^3$] (confirmed by the SIMS bulk measurement mode) by controlling the degassing time of SiO gas from the surface of the Si melt. Also, the Ar flow rate during ingot solidification was changed and a cover (provided with Ar gas inlet and outlet) was provided on the mold in order to decrease, as much as possible, contact between the Si melt and the atmosphere gas to prepare crystalline Si substrates having different carbon concentrations.

Then, the laser recrystallization step was performed under the same conditions as in Example 3 to form the low-oxygen-concentration region of the present invention.

Thereafter, samples of solar cell elements were formed and evaluated by the same method as in Example 1.

It was previously confirmed that the oxygen concentration in the first depletion region $5b_1$ below the bus bar electrodes $1a$ after element processing was same as (1E18 [atoms/cm$^3$] or less) in the constitution of the present invention.

Table 3 shows the relation between the carbon concentration in the substrate and element characteristics. The carbon concentration was a value after element processing and measured by the bulk measurement mode after SIMS analysis of a region at a depth of 10 μm from the pn junction.

TABLE 3

| Oxygen concentration in substrate [atoms/cm³] | Carbon concentration in substrate [atoms/cm³] | Oxygen concentration in first depletion region [atoms/cm³] | Efficiency [%] | Isc [A] | VOC [V] | FF |
|---|---|---|---|---|---|---|
| 2.5E17 | 3.2E17 | ≦9E17 | 15.83 | 7.982 | 0.610 | 0.756 |
| 2.5E17 | 2.8E17 | ≦9E17 | 15.99 | 7.996 | 0.611 | 0.761 |
| 2.5E17 | 2.2E17 | ≦9E17 | 16.02 | 8.001 | 0.611 | 0.762 |

All the samples shown in Table 3 are within the range of the present invention and show excellent element characteristics as compared with the conventional sample shown in Example 1. In particular, it was found that when the carbon concentration in the substrate is less than 3E17 [atoms/cm³] more satisfactory results are obtained.

The invention claimed is:

1. A photovoltaic conversion element comprising:
a semiconductor substrate of a first conductivity-type;
a semiconductor layer of a second conductivity-type different than the first conductivity-type on the semiconductor substrate, thereby forming a pn junction between the semiconductor substrate and the semiconductor layer;
an electrode on the semiconductor layer; and
a depletion region extending in a direction from the pn junction into the semiconductor substrate and in a second direction from the pn junction into the semiconductor layer,
wherein the depletion region comprises a first depletion region inside the semiconductor substrate and under the electrode,
wherein the first depletion region has an oxygen concentration of 1E18 [atoms/cm³] or less,
wherein the semiconductor substrate has an oxygen concentration higher than 2E17 [atoms/cm³] at a point of 10 μm in depth from the pn junction, and
wherein an oxygen concentration profile in the semiconductor substrate decreases in the direction from the pn junction into the semiconductor substrate, reaches a minimum value and then increases to form a convex shape and an inflection point.

2. The photovoltaic conversion element according to claim 1, wherein the electrode is a fired electrode formed by applying and firing a paste containing metal particles.

3. The photovoltaic conversion element according to claim 1, wherein the minimum value of the oxygen concentration profile is 2E17 [atoms/cm³] or less.

4. The photovoltaic conversion element according to claim 1, wherein the depletion region further comprises a second depletion region, the second depletion region being inside the semiconductor substrate and other than the first depletion region, and
wherein the second depletion region includes a portion having a higher oxygen concentration than that in the first depletion region.

5. The photovoltaic conversion element according to claim 1, wherein the semiconductor substrate has a carbon concentration of 3E17 [atoms/cm³] or less in a region at a depth of 10 μm from the pn junction.

6. The photovoltaic conversion element according to claim 1, wherein the semiconductor substrate is comprises a polycrystalline Si semiconductor.

7. A photovoltaic conversion module comprising:
a plurality of the photovoltaic conversion elements according to claim 1, wherein the photovoltaic conversion elements are electrically connected to each other in series or in parallel.

8. The photovoltaic conversion element according to claim 1, wherein the semiconductor substrate comprises crystalline Si.

* * * * *